United States Patent
Yamagishi et al.

(10) Patent No.: US 11,133,343 B2
(45) Date of Patent: Sep. 28, 2021

(54) IMAGING DEVICE AND ELECTRONIC DEVICE CONFIGURED BY BONDING A PLURALITY OF SEMICONDUCTOR SUBSTRATES INCLUDING A FIRST MULTILAYER HAVING A FIRST VERTICAL SIGNAL LINE FORMED IN A DIFFERRENT LAYER THAN THE LAYER OF A FIRST WIRING OF A FIRST CONNECTION REGION

(71) Applicant: SONY SEMICONDUCTOR SOLUTIONS CORPORATION, Kanagawa (JP)

(72) Inventors: Hajime Yamagishi, Kanagawa (JP); Shota Hida, Nagasaki (JP); Yuusaku Kobayashi, Nagasaki (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 9 days.

(21) Appl. No.: 16/614,955

(22) PCT Filed: May 2, 2018

(86) PCT No.: PCT/JP2018/017477
§ 371 (c)(1),
(2) Date: Nov. 19, 2019

(87) PCT Pub. No.: WO2018/216442
PCT Pub. Date: Nov. 29, 2018

(65) Prior Publication Data
US 2020/0243590 A1 Jul. 30, 2020

(30) Foreign Application Priority Data
May 26, 2017 (JP) .............................. JP2017-104991

(51) Int. Cl.
*H01L 27/146* (2006.01)

(52) U.S. Cl.
CPC .. *H01L 27/14634* (2013.01); *H01L 27/14636* (2013.01)

(58) Field of Classification Search
CPC ......... H01L 27/14634; H01L 27/14636; H01L 27/1469; H01L 2224/08145; H01L 24/80; H01L 23/522; H01L 27/146
(Continued)

(56) References Cited

U.S. PATENT DOCUMENTS 7,858,915 B2 * 12/2010 McCarten ........... H01L 27/1464
250/208.1
8,049,256 B2 * 11/2011 Guidash ............ H01L 27/14641
257/292

(Continued)

FOREIGN PATENT DOCUMENTS

| JP | 2009-004651 | 1/2009 |
| JP | 2012-064709 | 3/2012 |

(Continued)

OTHER PUBLICATIONS

International Search Report and Written Opinion prepared by the European Patent Office dated Jul. 11, 2018, for International Application No. PCT/JP2018/017477.

(Continued)

*Primary Examiner* — Que Tan Le
(74) *Attorney, Agent, or Firm* — Sheridan Ross P.C.

(57) ABSTRACT

An imaging device comprises a first chip that includes a first semiconductor substrate including a photoelectric conversion region. The first chip includes a first insulating layer including a first multilayer wiring electrically connected to the photoelectric conversion region. The first multilayer wiring includes a first vertical signal line (VSL1) to output a first pixel signal, and a first wiring. The imaging device includes a second chip including a second semiconductor (Continued)

substrate including a logic circuit. The second chip includes a second insulating layer including a second multilayer wiring electrically connected to the logic circuit. The second multilayer wiring includes a second wiring. The first chip and the second chip are bonded to one another, and, in a plan view, the first wiring and the second wiring overlap with at least a portion of the first vertical signal line (VSL1).

20 Claims, 22 Drawing Sheets

(58) Field of Classification Search
USPC .................................. 250/208.1, 214 R, 239
See application file for complete search history.

(56) References Cited

U.S. PATENT DOCUMENTS

| | | |
|---|---|---|
| 2011/0049336 A1 | 3/2011 | Matsunuma |
| 2012/0199930 A1 | 8/2012 | Hayashi |
| 2013/0092822 A1 | 4/2013 | Ichikawa et al. |
| 2013/0313616 A1 | 11/2013 | Matsunuma |
| 2014/0145288 A1 | 5/2014 | Hayashi |
| 2015/0179694 A1 | 6/2015 | Ichikawa et al. |
| 2016/0020240 A1 | 1/2016 | Hayashi |
| 2016/0284756 A1 | 9/2016 | Ichikawa et al. |
| 2017/0053961 A1 | 2/2017 | Hayashi |
| 2018/0166493 A1 | 6/2018 | Hayashi |

FOREIGN PATENT DOCUMENTS

| | | |
|---|---|---|
| JP | 2012-164870 | 8/2012 |
| JP | 2012-244101 | 12/2012 |
| JP | 2013-073988 | 4/2013 |
| JP | 2015-135938 | 7/2015 |
| TW | 201241999 | 10/2011 |
| TW | 201133809 | 10/2012 |

OTHER PUBLICATIONS

Official Action (with English translation) for Japanese Patent Application No. 2017-104991, dated Nov. 17, 2021, 10 pages.
Official Action (with English translation) for Japan Patent Application No. 2017-104991, dated Feb. 2, 2021, 6 pages.
Official Action for Taiwan Patent Application No. 107106058, dated Jul. 7, 2021, 9 pages.
Official Action (with English translation) for Japan Patent Application No. 2017-104991, dated Jun. 29, 2021, 10 pages.

* cited by examiner

[Fig. 1]
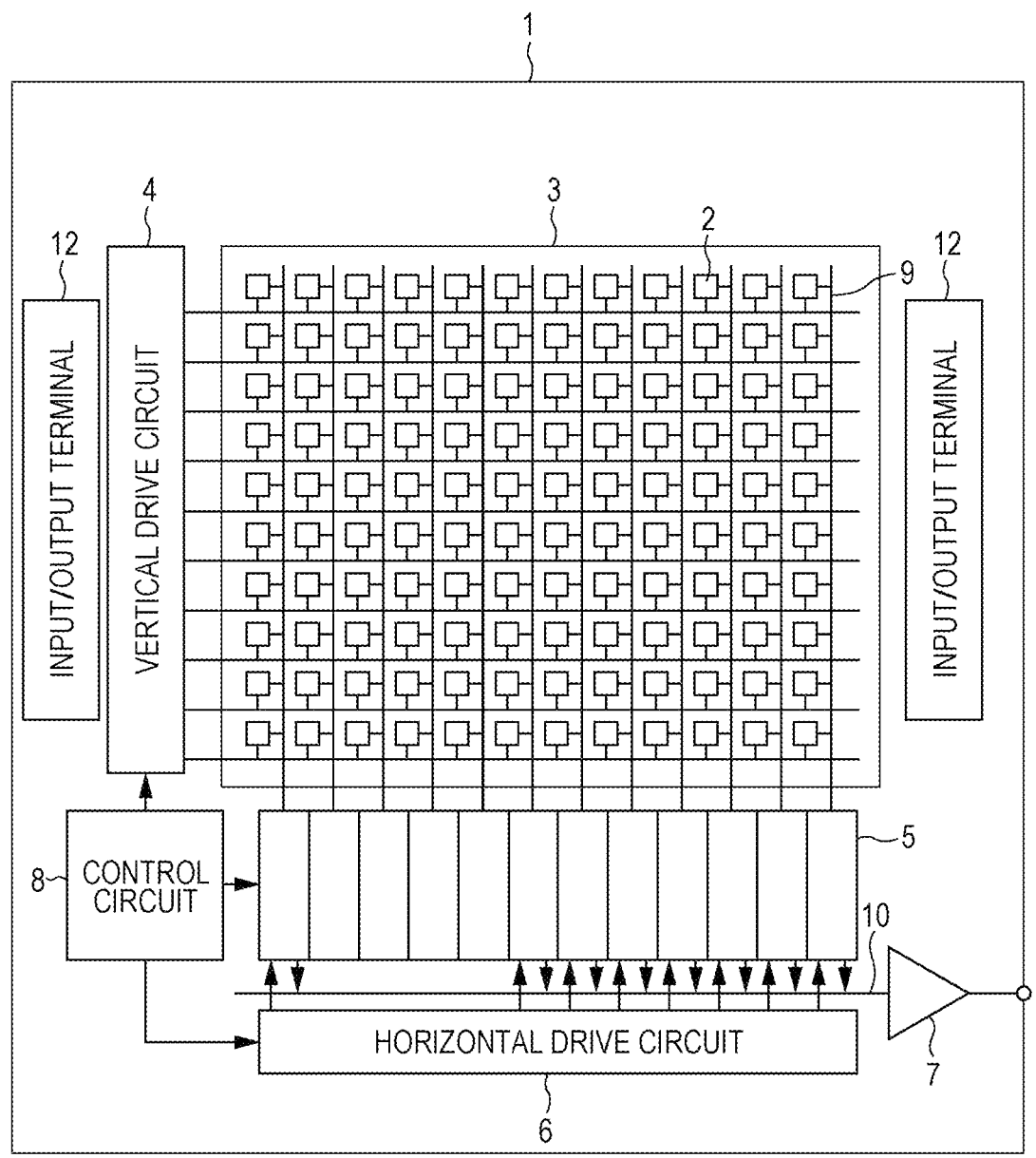

[Fig. 2]
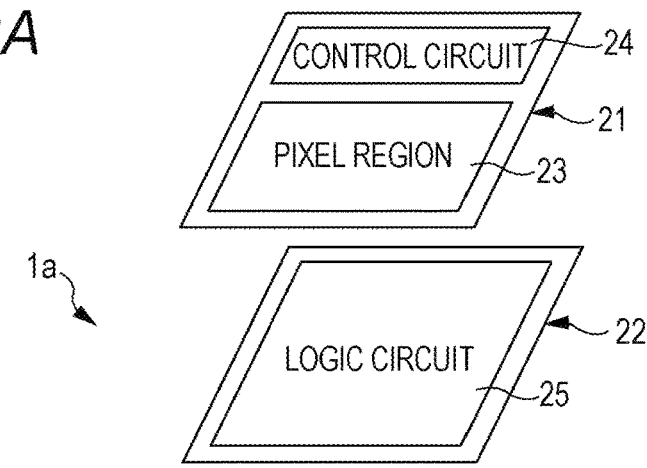
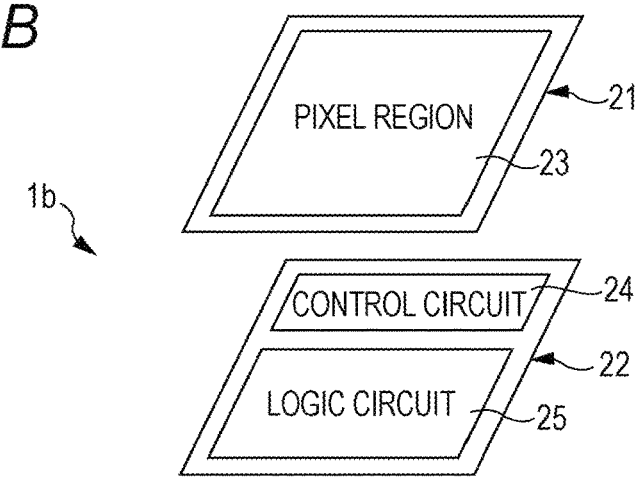
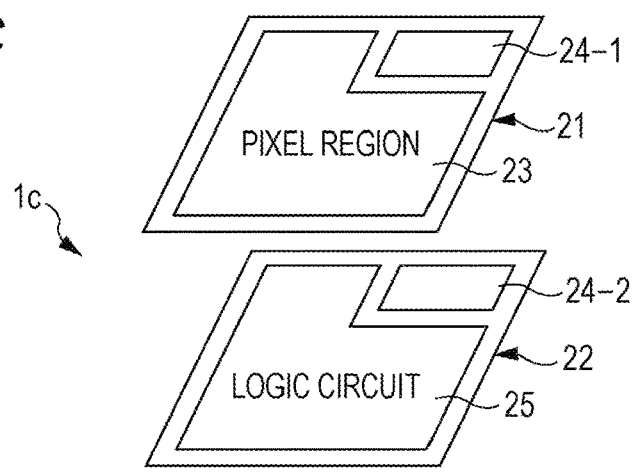

[Fig. 3]
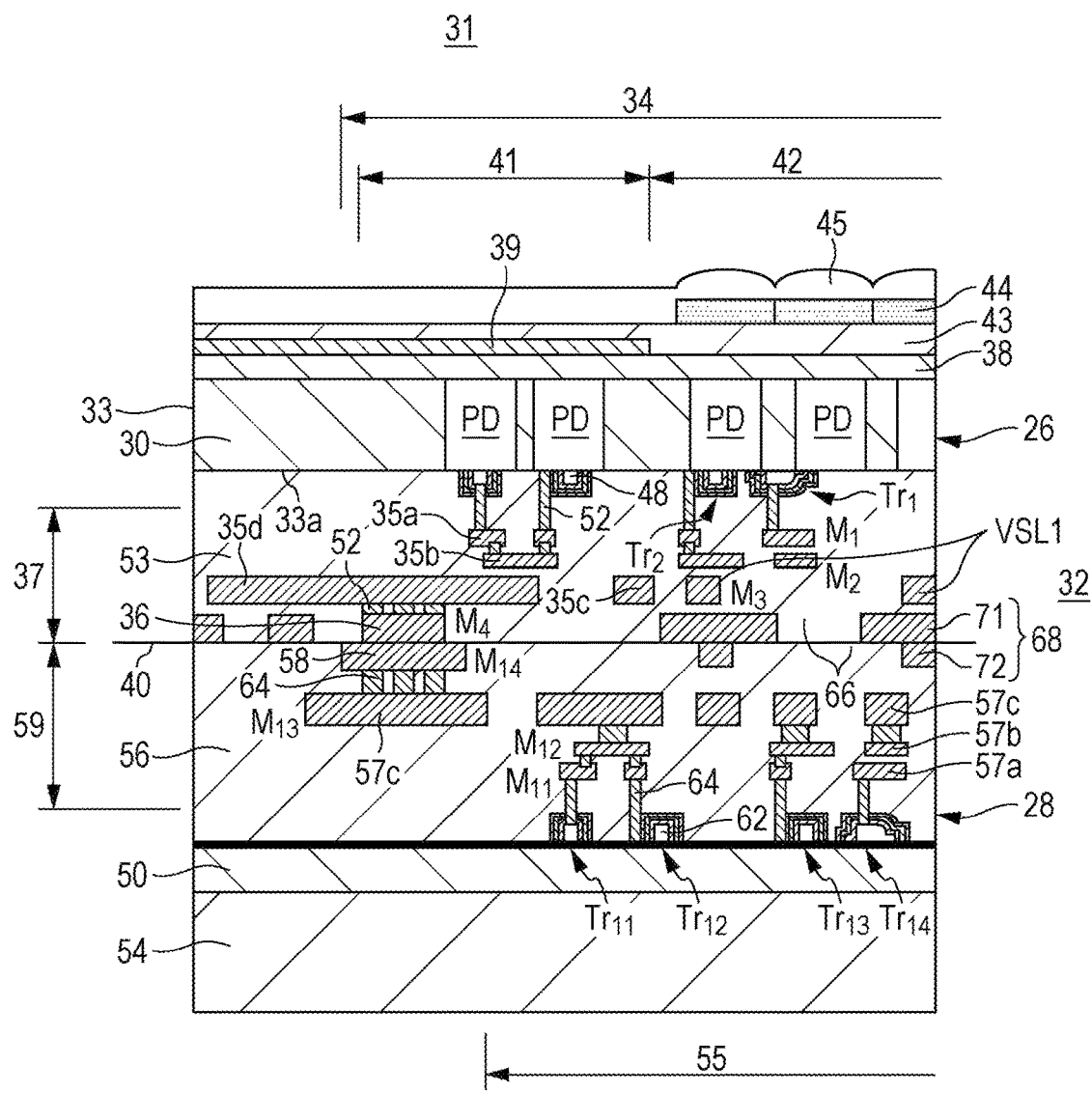

[Fig. 4]
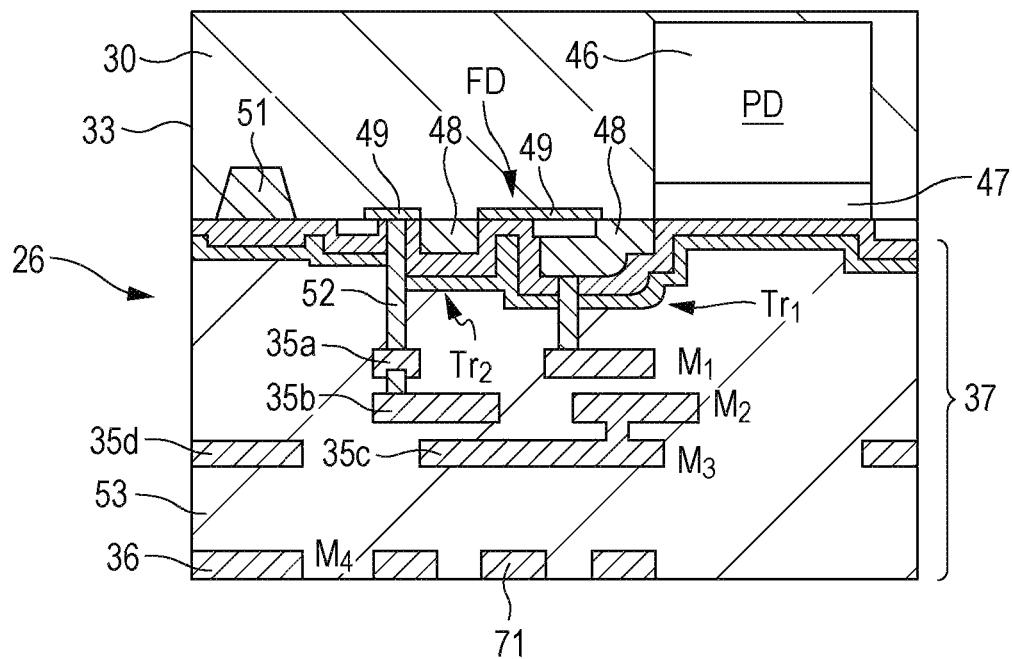
[Fig. 5]
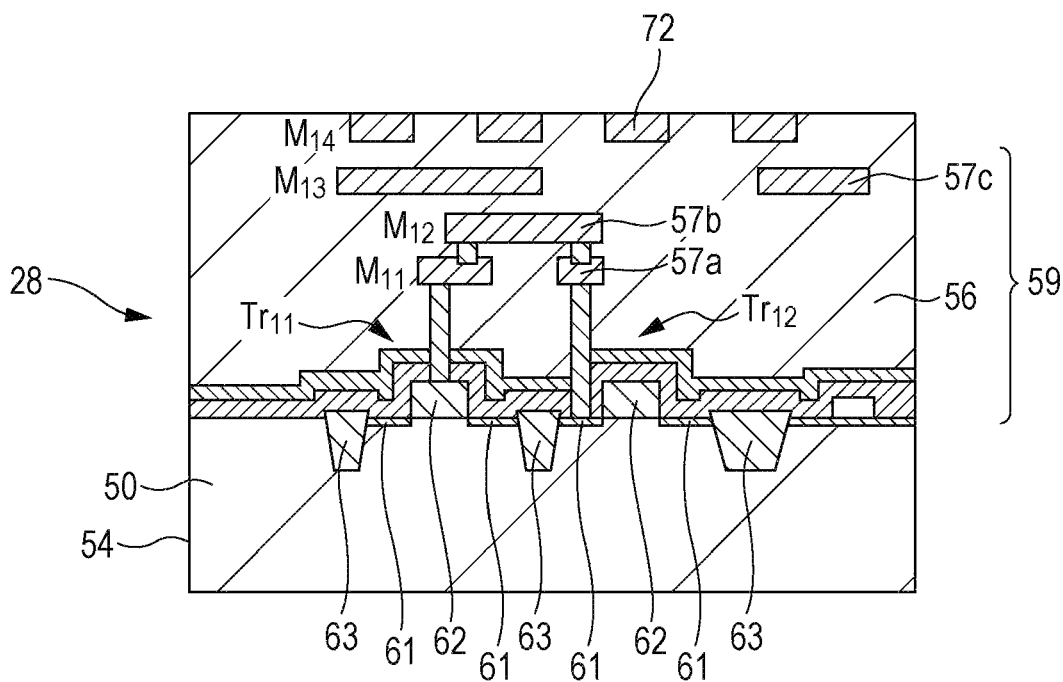

[Fig. 6]
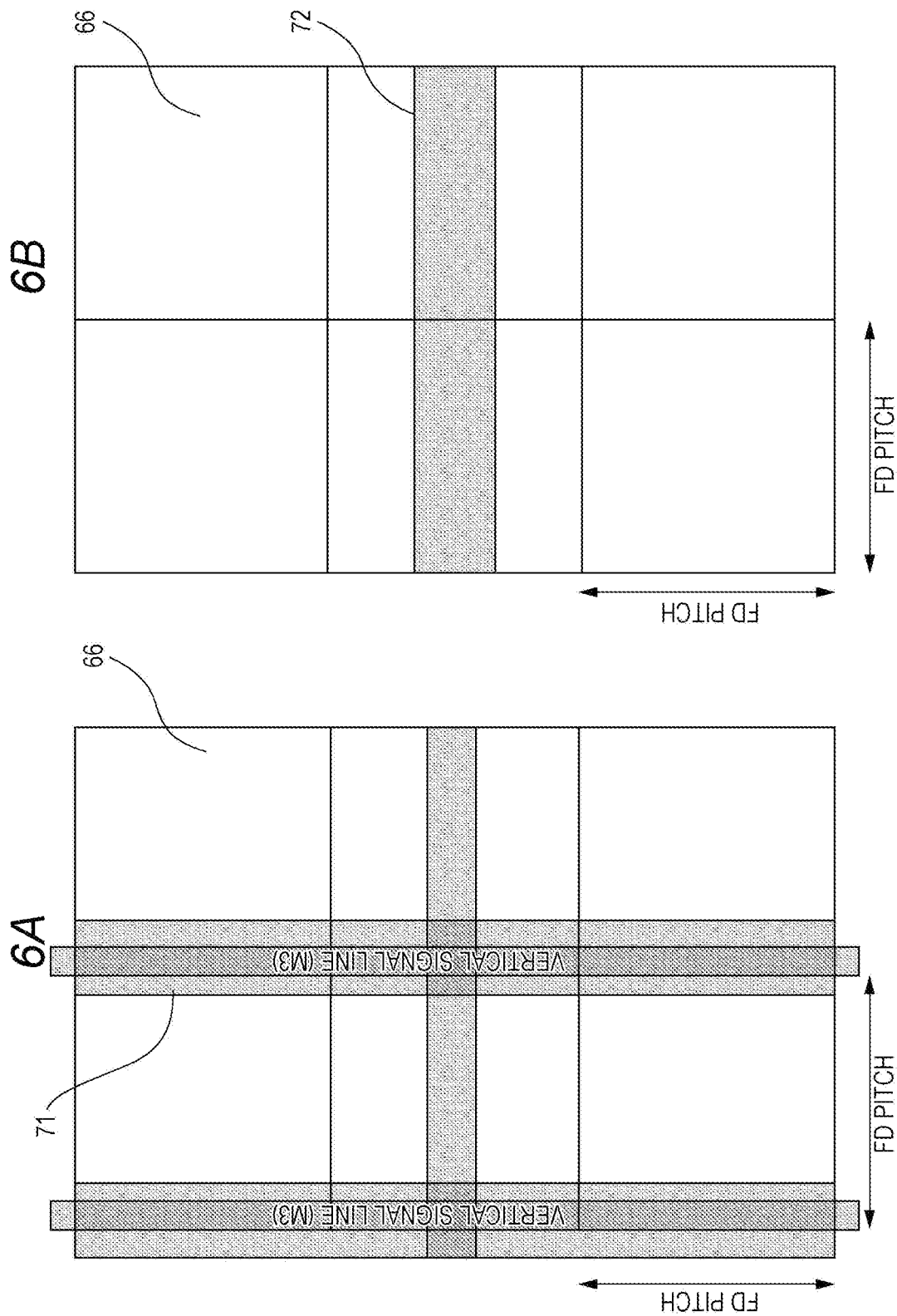

[Fig. 7]
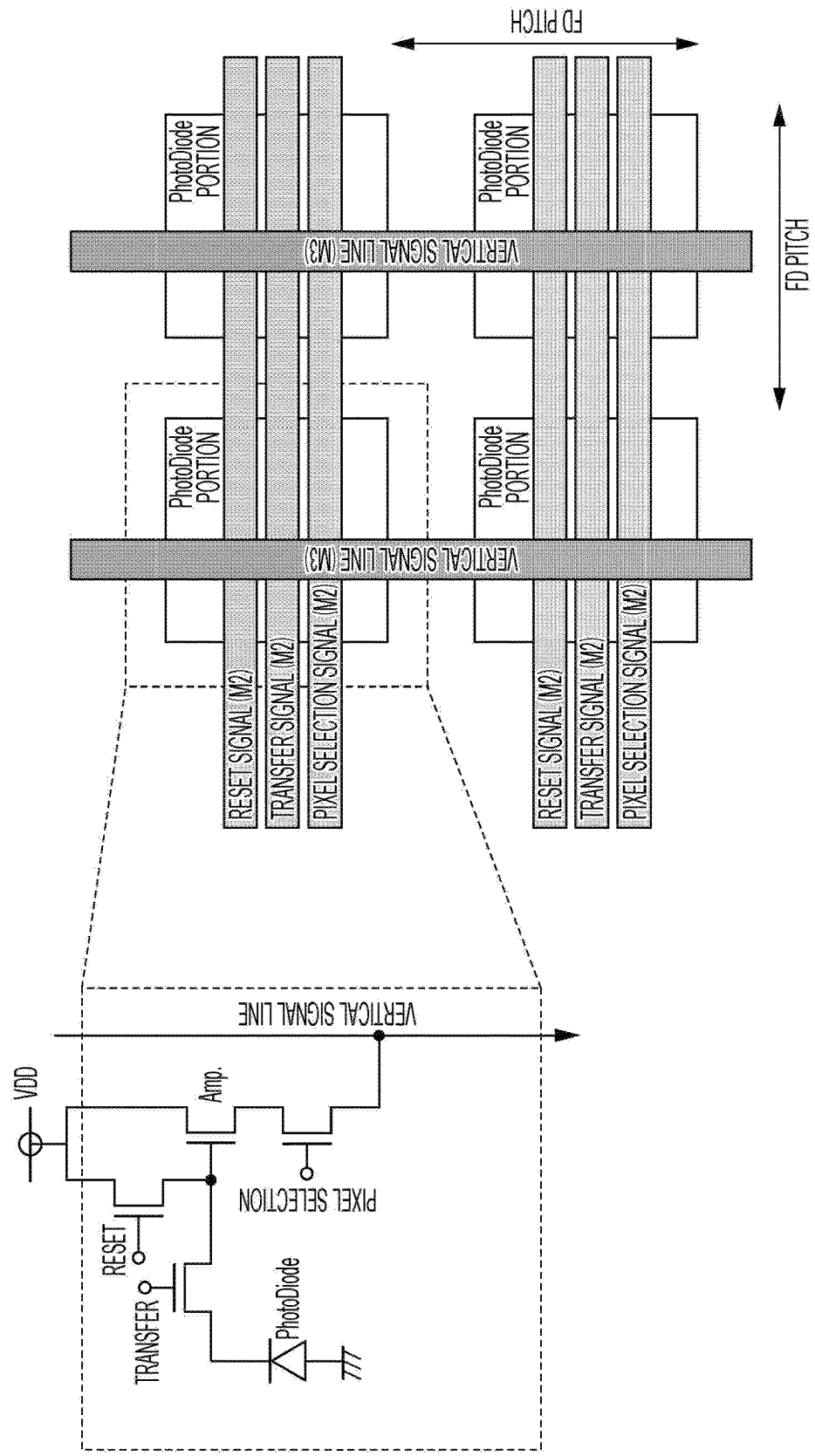

[Fig. 8]
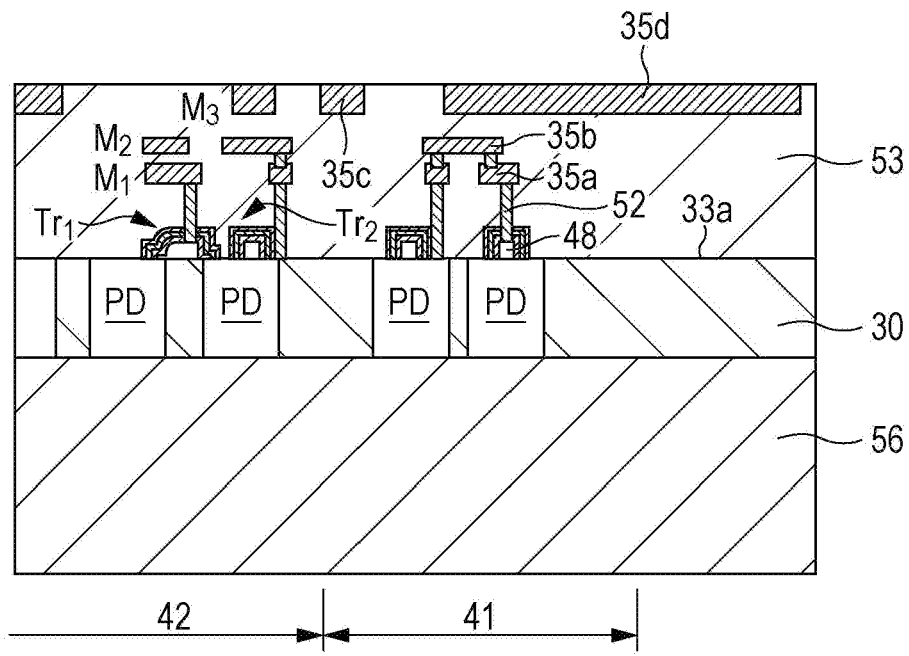
[Fig. 9]
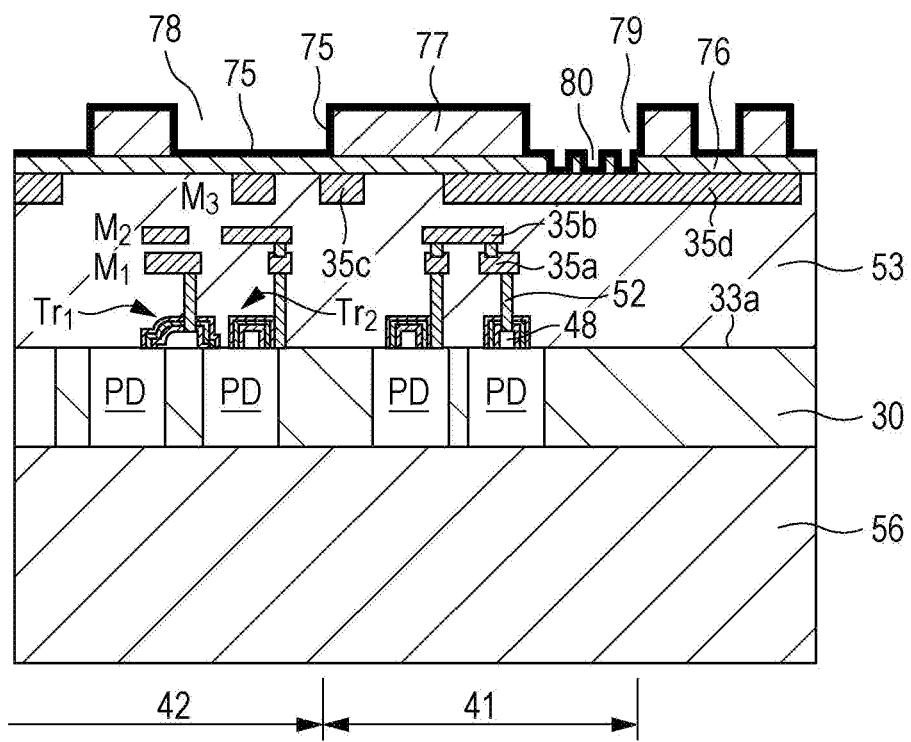

[Fig. 10]
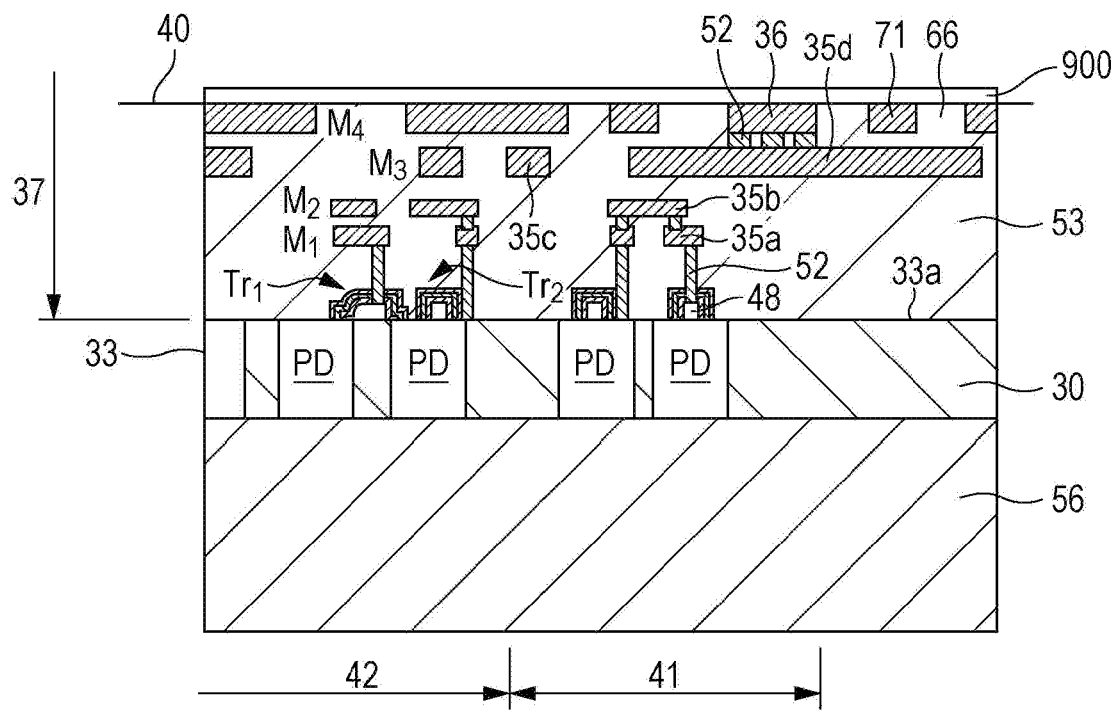
[Fig. 11]
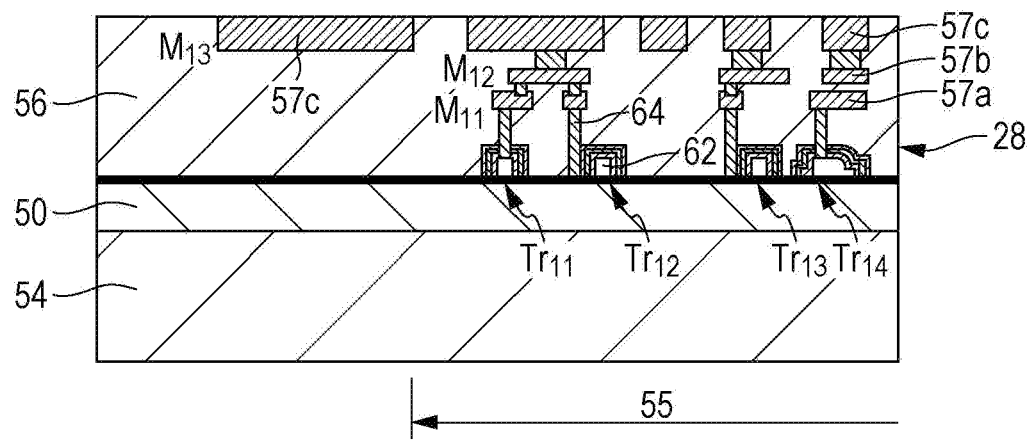

[Fig. 12]
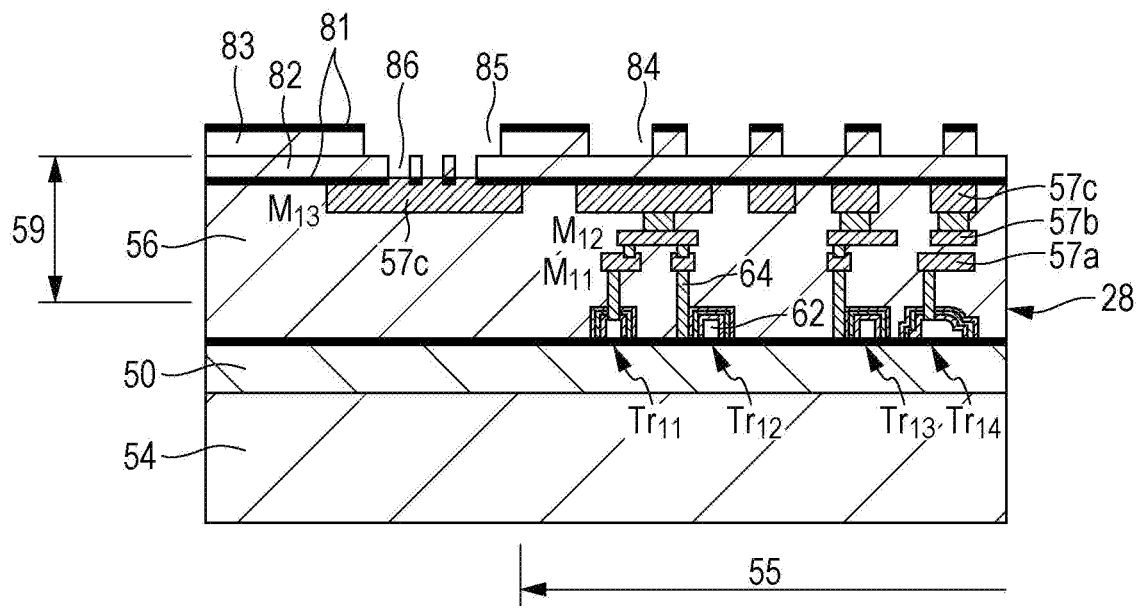
[Fig. 13]
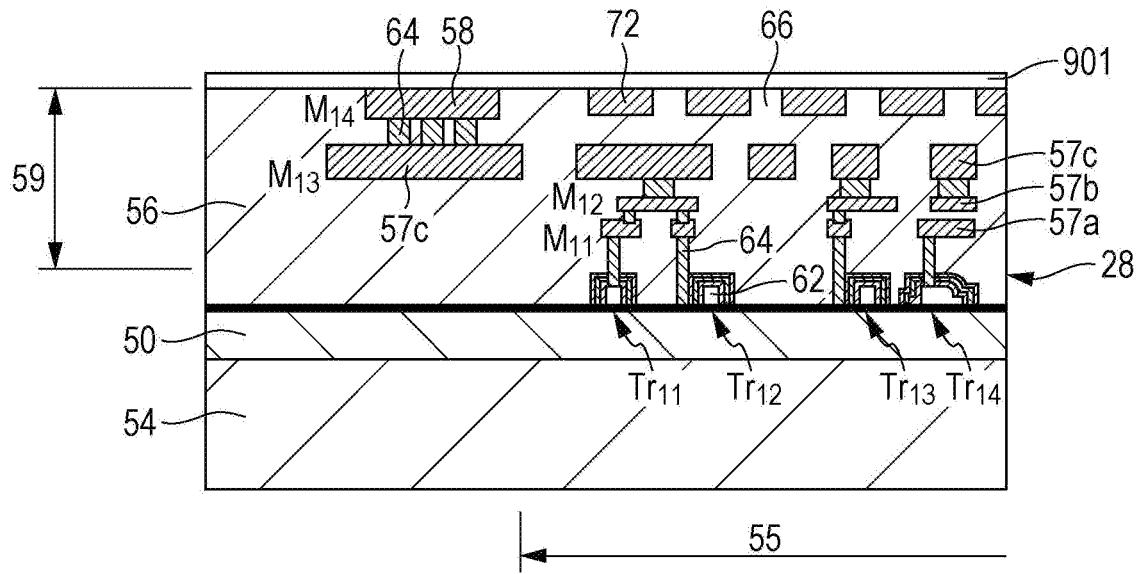

[Fig. 14]
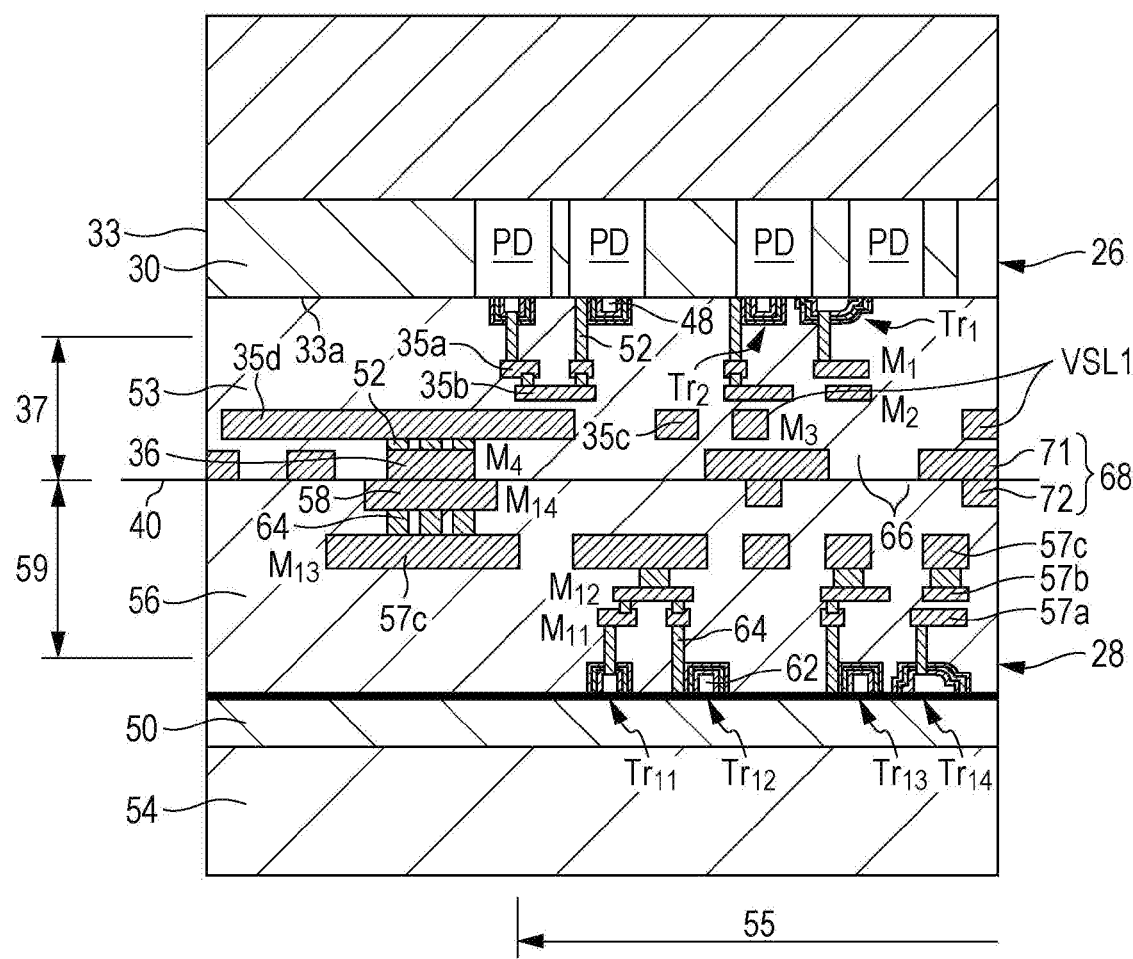

[Fig. 15]
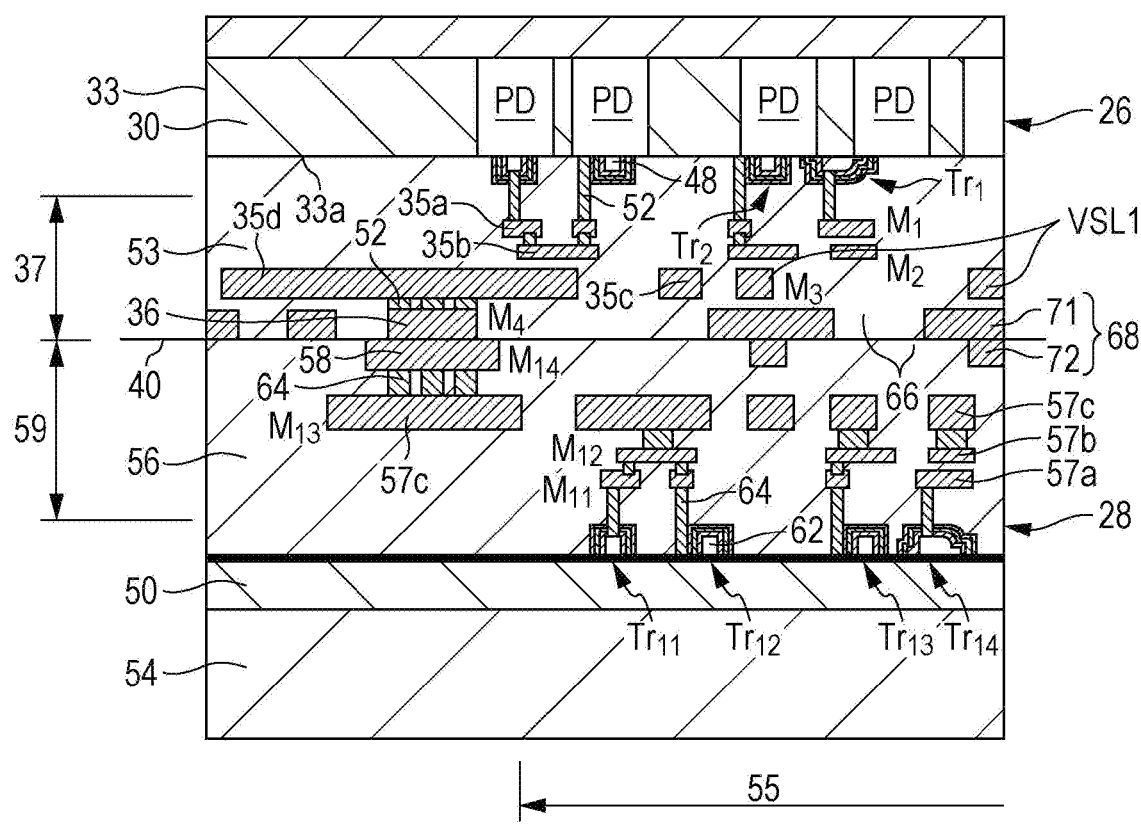

[Fig. 16]
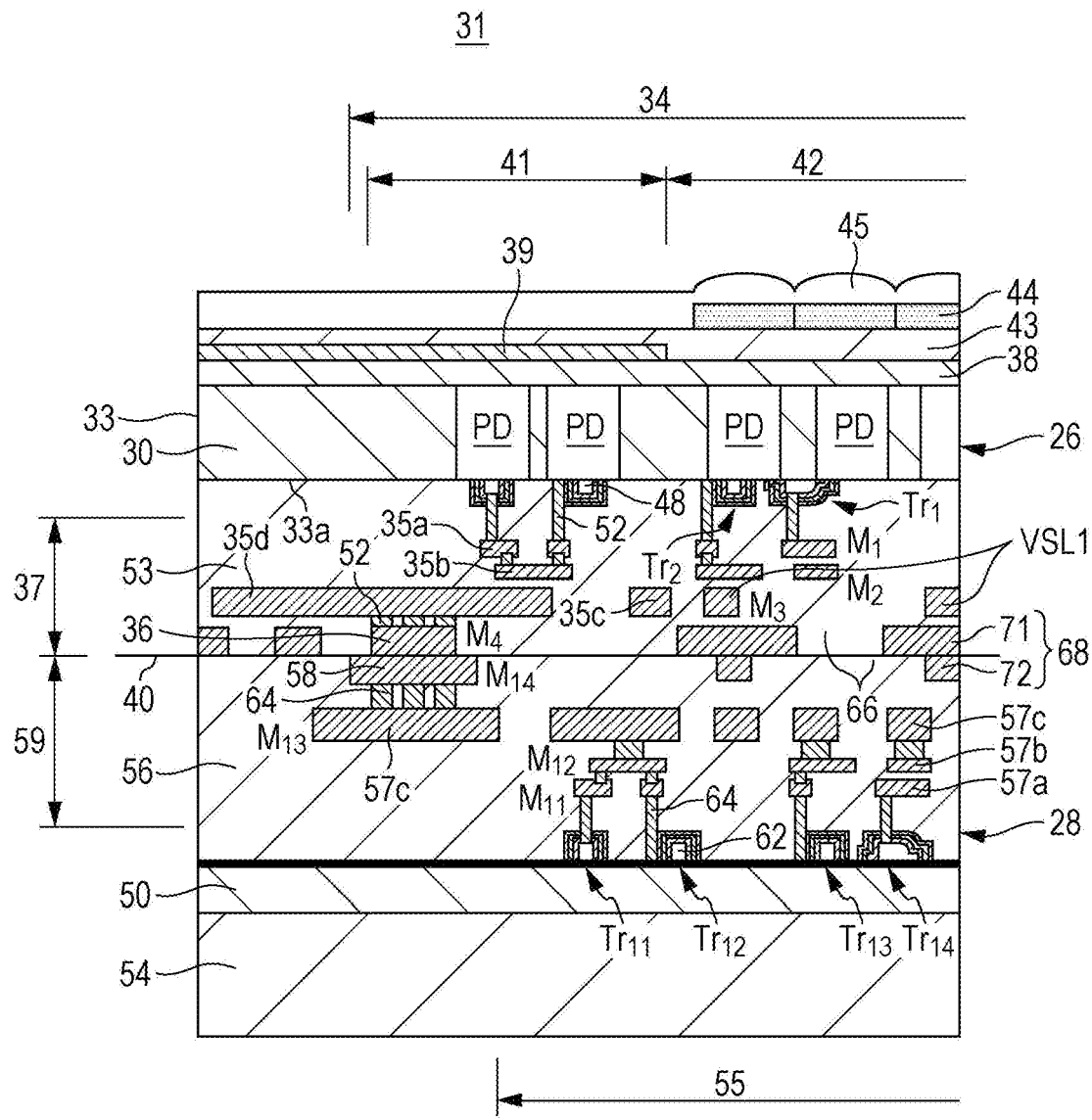

[Fig. 17]
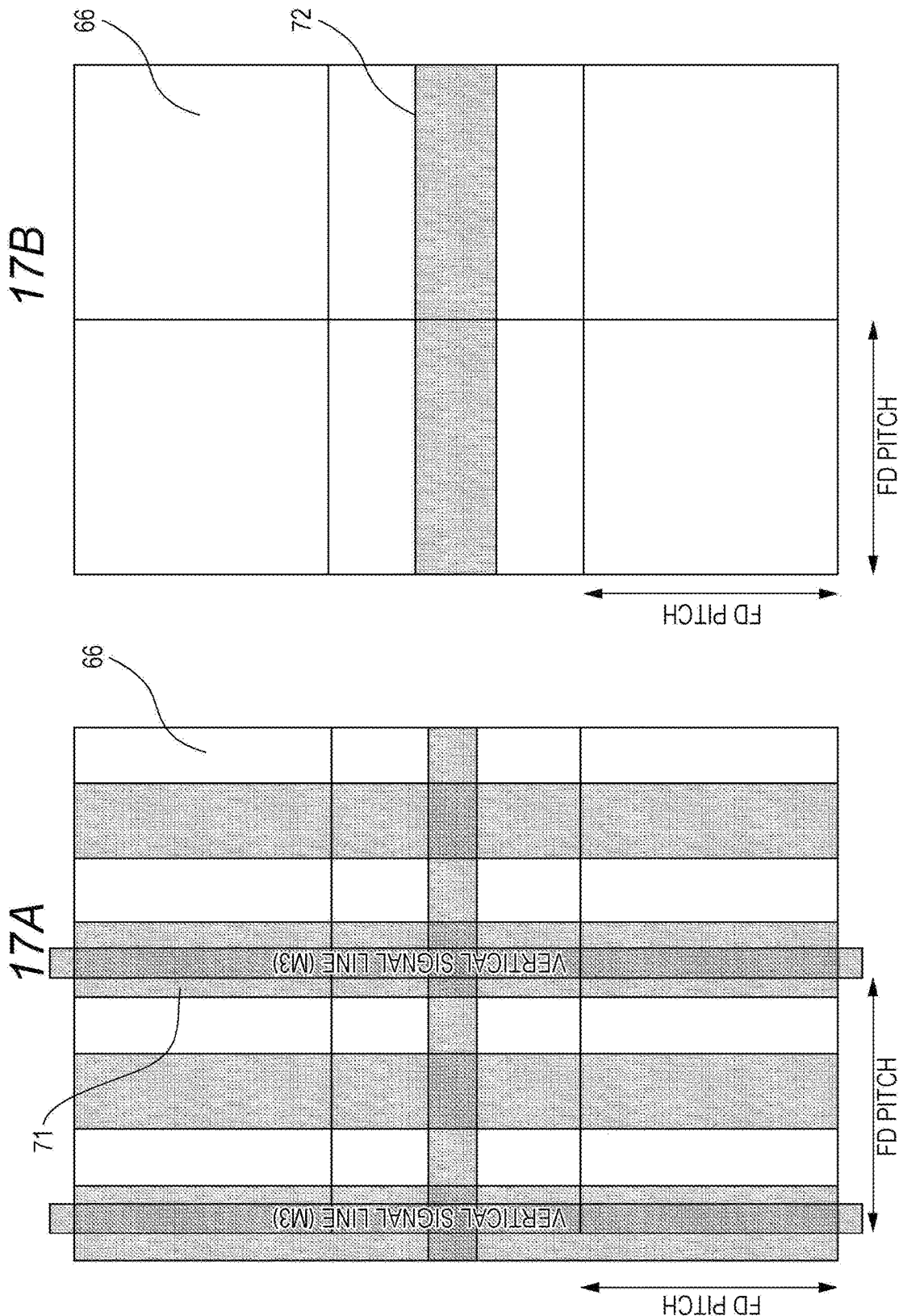

[Fig. 18]
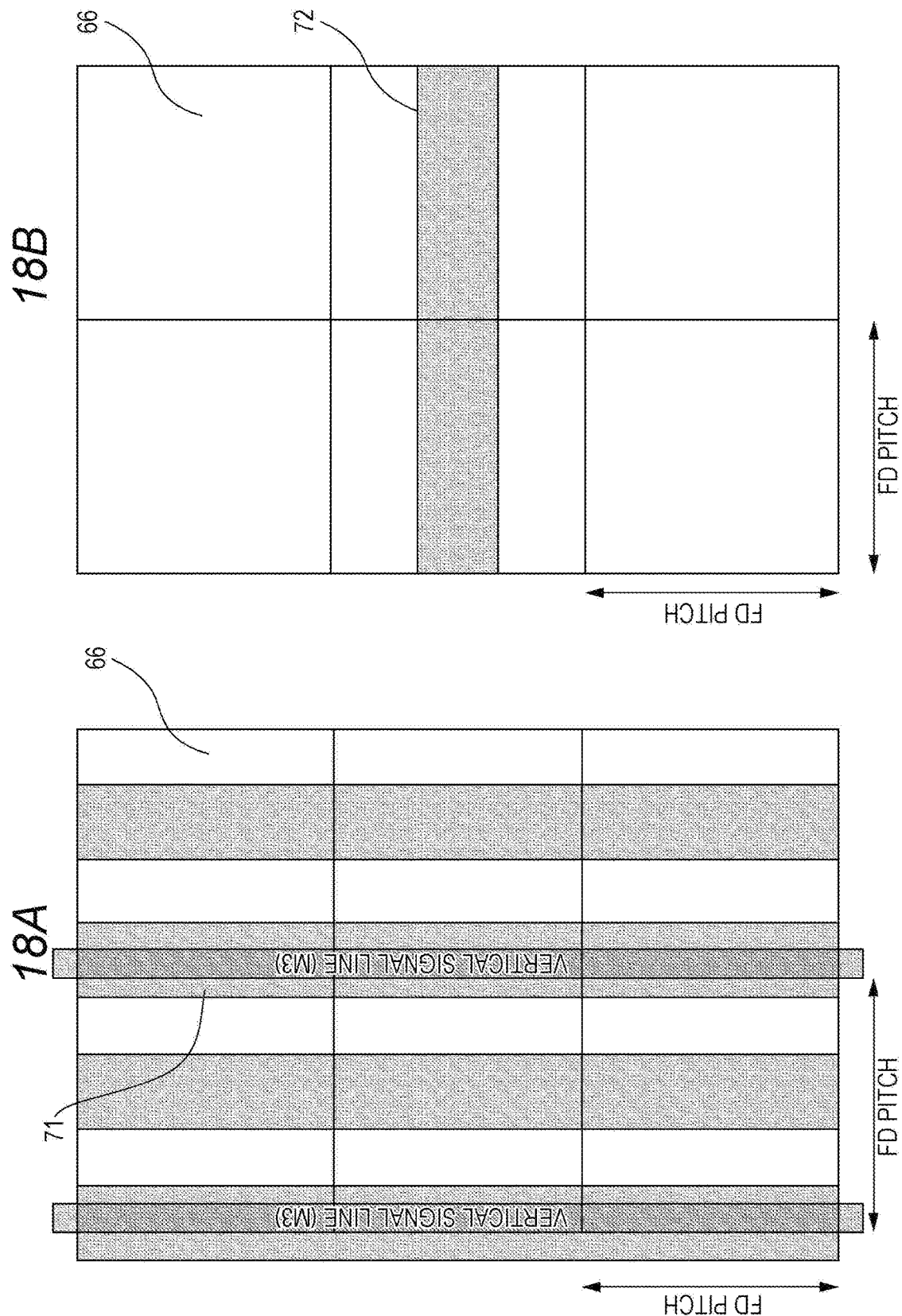

[Fig. 19]
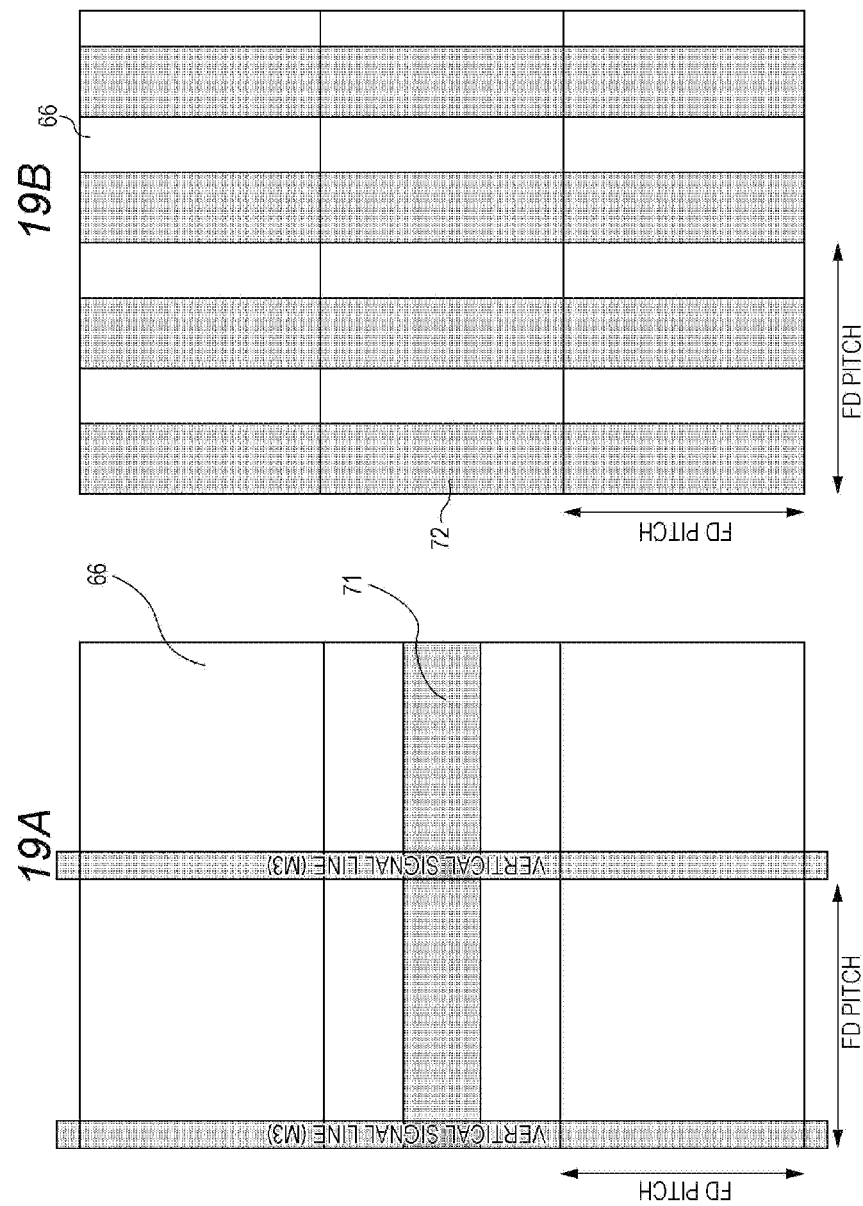

[Fig. 20]
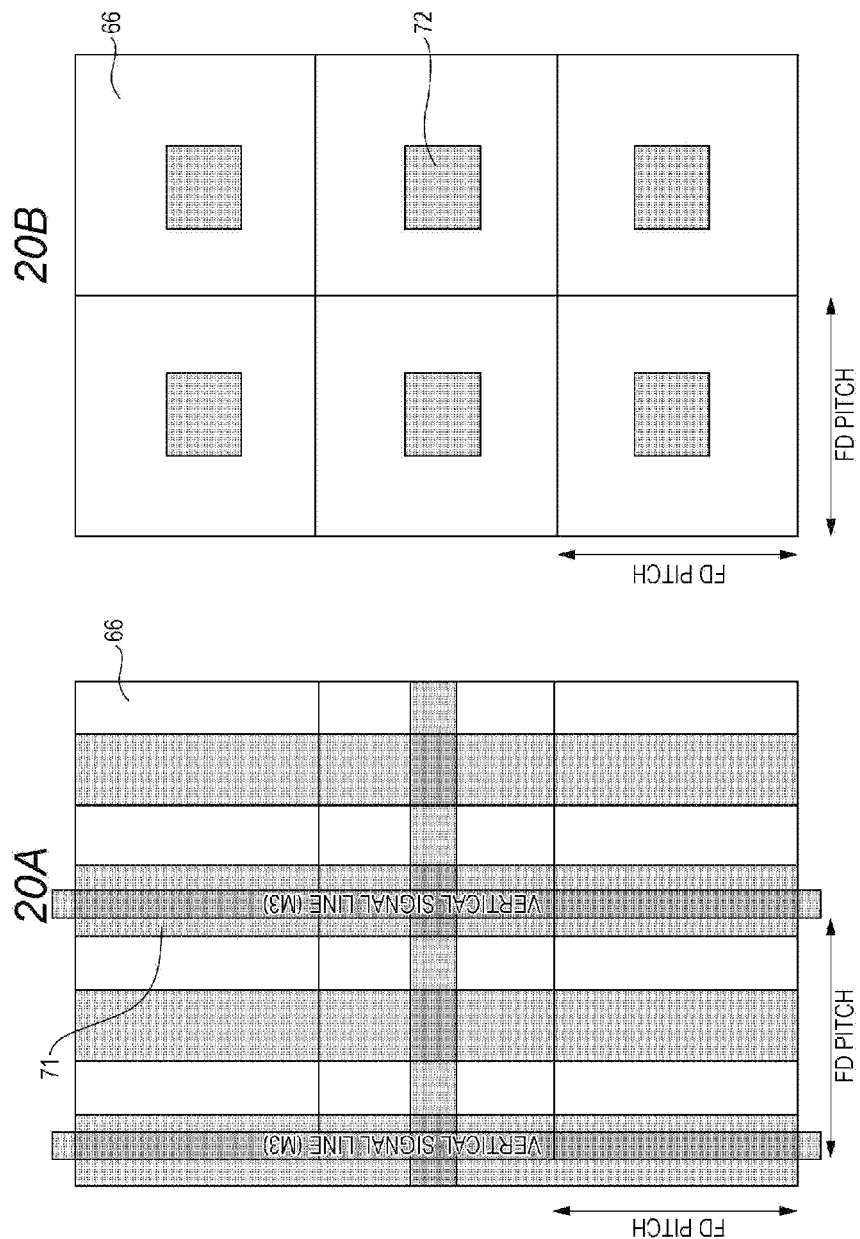

[Fig. 21]
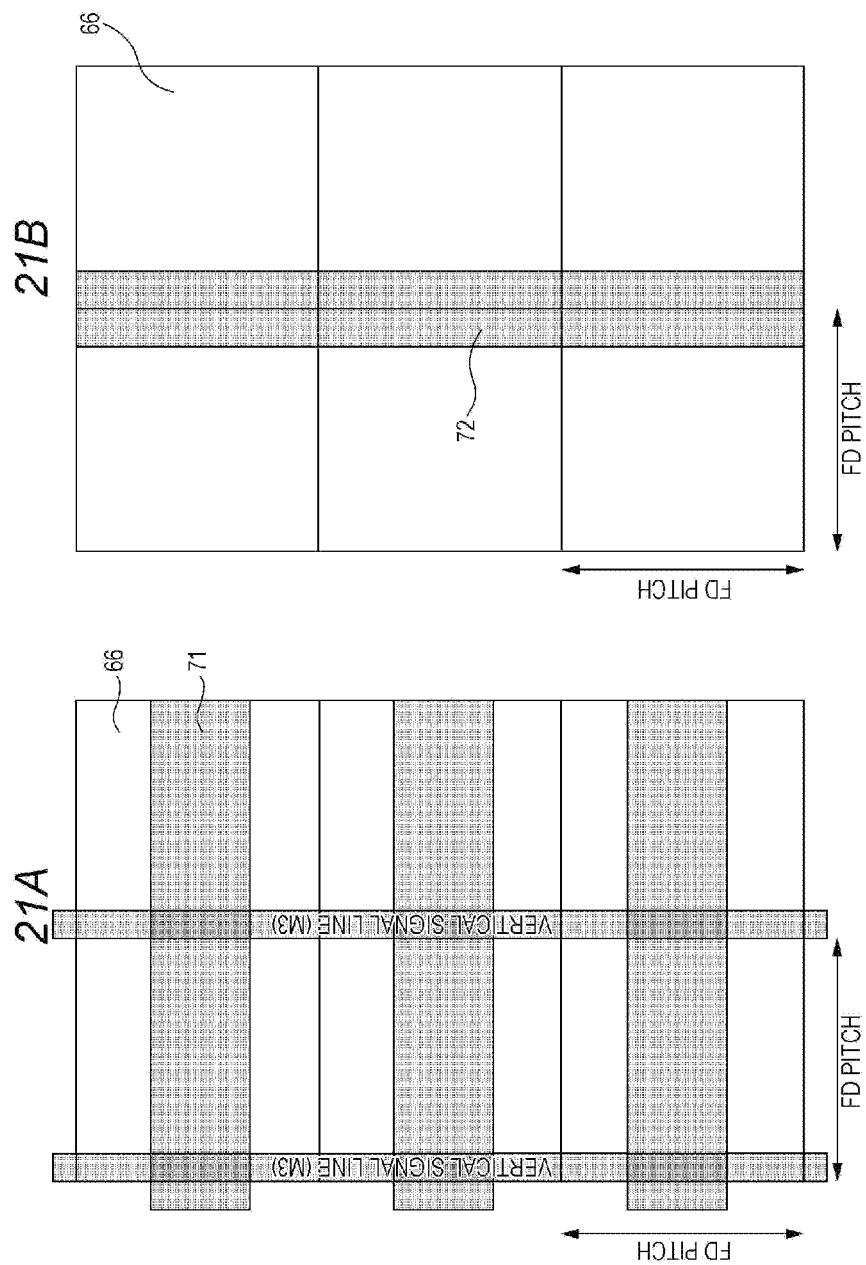

[Fig. 22]
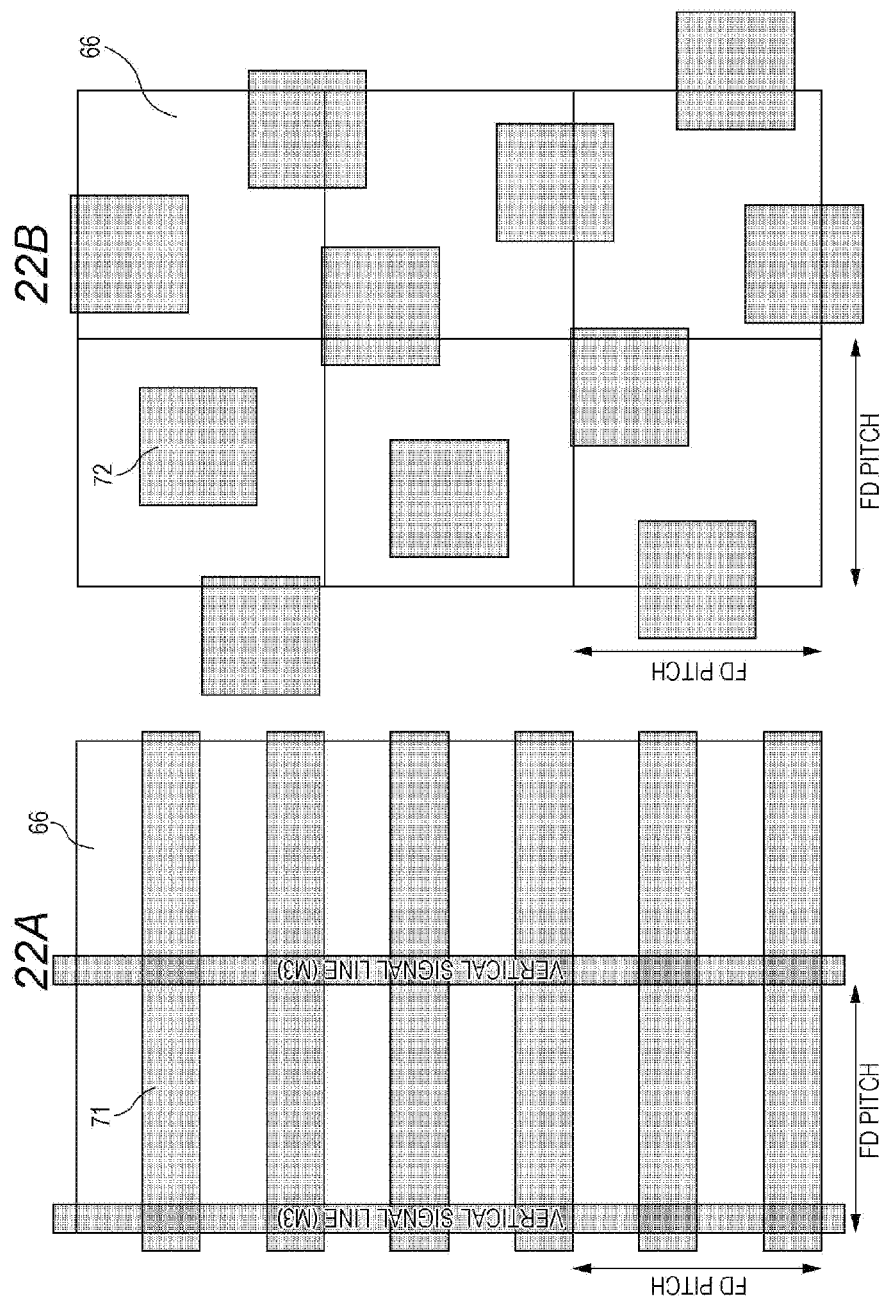

[Fig. 23]
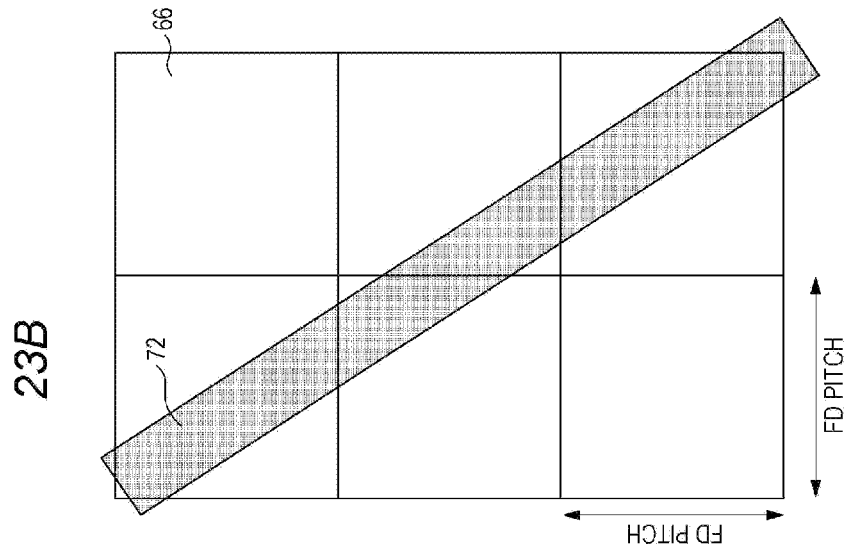
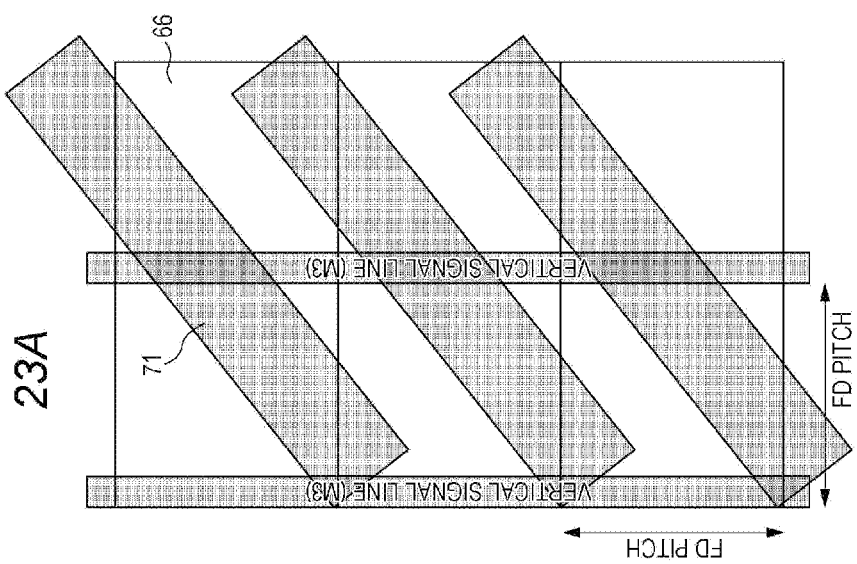

[Fig. 24]
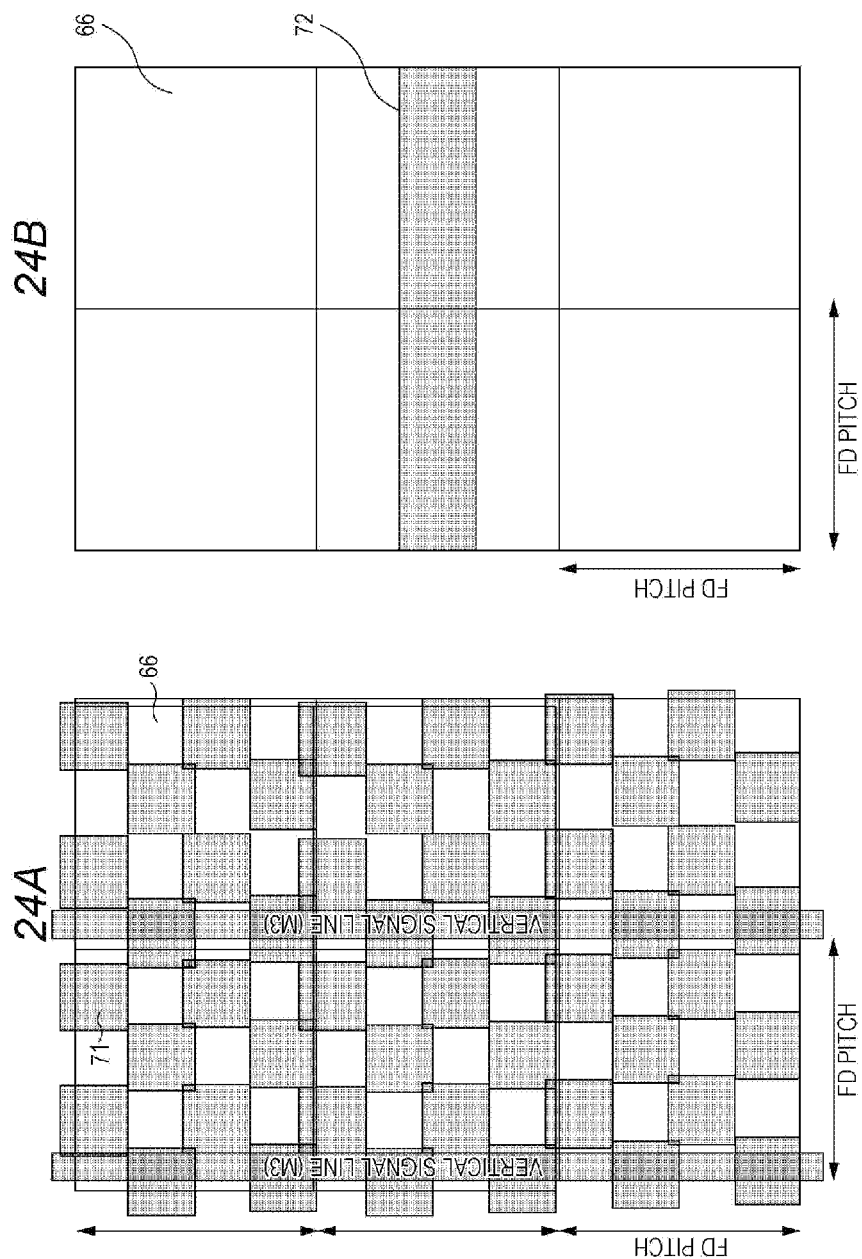

[Fig. 25]
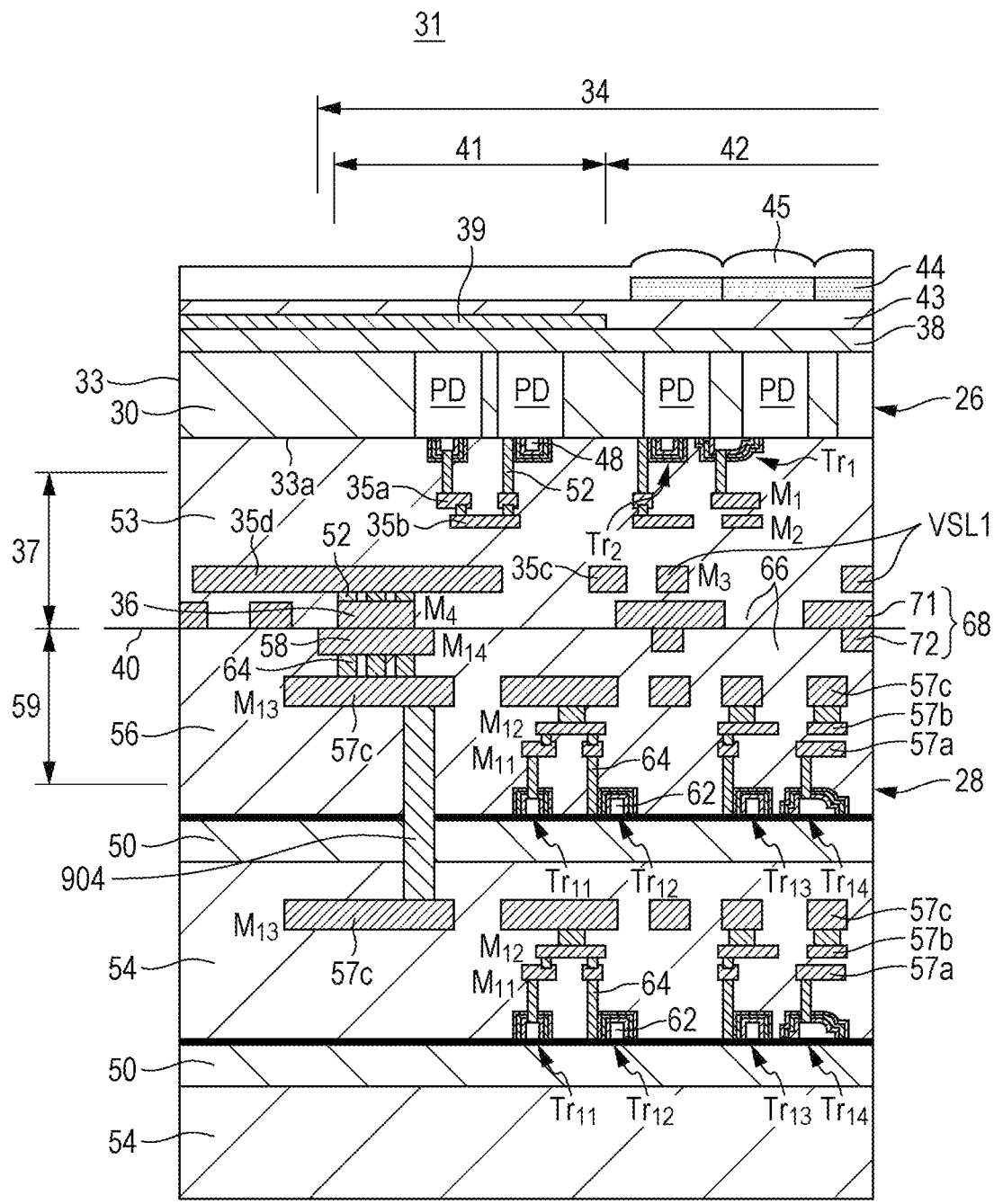

[Fig. 26]
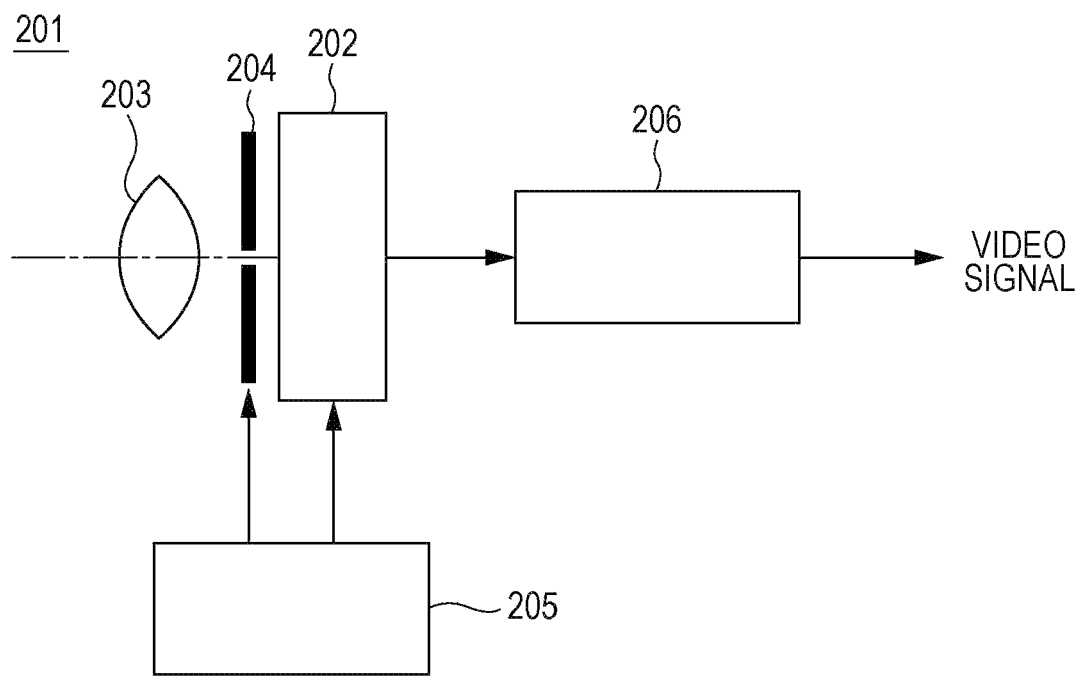

IMAGING DEVICE AND ELECTRONIC DEVICE CONFIGURED BY BONDING A PLURALITY OF SEMICONDUCTOR SUBSTRATES INCLUDING A FIRST MULTILAYER HAVING A FIRST VERTICAL SIGNAL LINE FORMED IN A DIFFERRENT LAYER THAN THE LAYER OF A FIRST WIRING OF A FIRST CONNECTION REGION

CROSS REFERENCE TO RELATED APPLICATIONS

This application is a national stage application under 35 U.S.C. 371 and claims the benefit of PCT Application No. PCT/JP2018/017477 having an international filing date of 2 May 2018, which designated the United States, which PCT application claimed the benefit of Japanese Priority Patent Application No. 2017-104991 filed on 26 May 2017, the disclosures of each of which are incorporated herein by reference.

TECHNICAL FIELD

The present technology relates to an imaging device, and an electronic device, and especially relates to a technology of an imaging device configured by bonding a plurality of semiconductor substrates.

BACKGROUND ART

In recent years, digital cameras have become increasingly popular. With the popularization of the digital cameras, solid state image sensors (image sensors) that are principal components of the digital cameras have been increased in demand. In the aspect of performance of the solid state image sensors, technologies for realizing high picture quality and high functionality are in progress.

Meanwhile, mobile terminals having an imaging function (mobile phones, personal digital assistants (PDAs), note personal computers (PCs), tablet PCs, and the like) have become popular. With the popularization of the mobile terminals, to enhance portability of the mobile terminals, downsizing, reduction in weight, and thinning of the solid state image sensors and components configuring thereof are in progress. Further, to expand with the spread of the mobile terminals, reduction in cost of the solid state image sensors and components configuring thereof are in progress.

Typically, a solid state image sensor such as a complementary metal oxide semiconductor (CMOS) image sensor is configured by forming a photoelectric conversion unit, an amplifier circuit, and a multilayer wiring layer on a light-receiving surface side of a silicon substrate, and further forming a color filter and an on-semiconductor substrate microlens on the silicon substrate. A cover glass is further bonded on the light-receiving surface side with a spacer such as an adhesive. Further, a terminal is formed on an opposite side of the light-receiving surface side.

A signal processing circuit that performs predetermined processing for an output signal is connected to the solid state image sensor. With multi-functionalization of the solid state image sensor, processing performed in the signal processing circuit tends to increase.

To downsize the configuration in which the plurality of semiconductor substrates is connected, various steps have been taken. For example, a plurality of semiconductor substrates is sealed in one package by a system in package (SiP) technology. With the sealing, a mount area can be made small and downsizing of the entire configuration can be realized. However, a transmission distance becomes long due to wiring that connects the semiconductor substrates in the SiP technology, and high-speed operation may be hindered.

By the way, for example, PTL 1 describes a solid state image sensor configured by bonding and bonding a first semiconductor substrate including a pixel region (pixel array) and a second semiconductor substrate including a logic circuit together. According to such a configuration, a signal can be transmitted at a high speed. In this solid state image sensor, the first semiconductor substrate including a semifinished pixel array and the second semiconductor substrate including a semifinished logic circuit are bonded together and the first semiconductor substrate is thinned, and then the pixel array and the logic circuit are connected. The connection is performed by forming connection wiring including a connection conductor connected with necessary wiring of the first semiconductor substrate, a through connection conductor penetrating the first semiconductor substrate and connected with necessary wiring of the second semiconductor substrate, and a coupling conductor that connects the connection conductors. After that, the solid state image sensor is made into a finished product and into a semiconductor substrate, and is configured as a back illuminated solid state image sensor.

Meanwhile, in a solid state image sensor of PTL 2 as a newer technology in the solid state image sensor configured by bonding the first and second semiconductor substrates, a method of taking out and connecting copper (Cu) electrodes on both the semiconductor substrate surfaces, instead of the electrical connection method with the through connection conductor, is considered.

Further, in a solid state image sensor in PTL 3, the above-described copper (Cu) electrodes are used as a shielding layer. With the configuration, light emission due to hot carrier from a transistor of the logic circuit is shielded and entering of light toward the pixel array is suppressed. Further, when the first and second semiconductor substrates are bonded, capacitive coupling occurs in a portion where an insulating film is connected, and a problem in image quality may occur. In contrast, according to the solid state image sensor in PTL 3, formation of the shielding layer can suppress generation of the capacitive coupling. Further, PTL 3 describes that the thickness of the entire semiconductor substrate after bonding is also suppressed. Note that, to use the copper electrode as the shielding layer like PTL 3, a surface occupancy ratio (coverage) of the copper electrode needs to be set to a fixed high ratio. Here, the "surface occupancy ratio" refers to a ratio of a surface area of a shielding portion to a surface area of one pixel unit.

CITATION LIST

Patent Literature

PTL 1: JP 2012-64709A
PTL 2: JP 2013-73988A
PTL 3: JP 2012-164870A

SUMMARY

Technical Problem

However, the solid state image sensor in PTL 3 does not have a region where an insulating film of an upper substrate and an insulating film of a lower substrate are directly bonded on a bonding surface of the semiconductor substrates, and thus bonding strength becomes low and a void (bubble) is easily formed at the time of bonding the semiconductor substrates. If the void is formed, the semiconductor substrates may be separated in a process of thinning a Si substrate of a first semiconductor wafer, which is performed after bonding the wafer, because of low bonding strength of the void portion.

A cause of the separation is that the bonding strength of regions where copper and copper, and copper and an insulating film are directly bonded is lower than the bonding strength of the region where the insulating film and the insulating film are directly bonded. Therefore, to decrease separation at the time of bonding the semiconductor substrates, a ratio of the region where the insulating film and the insulating film are directly bonded needs to be secured to a fixed ratio or more.

The present technology has been made in view of the foregoing, and it is desirable to provide an imaging device that can improve bonding strength of semiconductor substrates while suppressing occurrence of voids in a bonded portion of the semiconductor substrates.

Solution to Problem

According to an embodiment of the present technology, an imaging device comprises a first chip including a first semiconductor substrate including a photoelectric conversion region that converts incident light into electric charge; and a first insulating layer including a first multilayer wiring electrically connected to the photoelectric conversion region. The first multilayer wiring includes a first vertical signal line to output a first pixel signal based on the electric charge, and a first wiring. The imaging device includes a second chip including a second semiconductor substrate including a logic circuit to process the first pixel signal; and a second insulating layer including a second multilayer wiring electrically connected to the logic circuit. The second multilayer wiring includes a second wiring. The first chip and the second chip are bonded to one another via at least the first wiring and the second wiring, and, in a plan view, the first wiring and the second wiring overlap with at least a portion of the first vertical signal line.

In some embodiments a portion of the first insulating layer and a portion of the second insulating layer are bonded to one another.

In some embodiments the first vertical signal line may extend in a first direction, and the first wiring may include a first portion extending in a first direction and overlapping the first vertical signal line in the plan view.

In some embodiments a width of the first portion measured in a second direction may be greater than a width of the first vertical signal line measured in the second direction, and the second direction may be perpendicular to the first direction.

In some embodiments, in the plan view, the first portion may overlap an entire width of the first vertical signal line for an entire length of the first portion in the first direction.

In some embodiments the first wiring may include a second portion extending in a second direction that is perpendicular to the first direction.

In some embodiments the second wiring may extend in the second direction.

In some embodiments, in the plan view, a width of the second wiring in the first direction may be greater than a width of the second portion of the first wiring in the first direction.

In some embodiments, in the plan view, the second wiring and the second portion of the first wiring may overlap.

In some embodiments, in the plan view, the second wiring may overlap an entirety of the second portion of the first wiring.

In some embodiments the first vertical signal line may extend in a first direction, and the first wiring may extend in a second direction that is perpendicular to the first direction, and the second wiring extends in the first direction and overlaps the first vertical signal in the plan view, the second portion extending in the second direction.

In some embodiments, in the plan view, the second wiring may overlap an entirety of the first vertical signal line for an entire length of the first portion.

According to another embodiment of the present technology, an imaging device comprises a first chip including a first semiconductor substrate including a plurality of pixel regions arranged in a matrix and that convert incident light into electric charge; and a first insulating layer including a first multilayer wiring electrically connected to the plurality of pixel regions. The first multilayer wiring includes a plurality of vertical signal lines to output respective pixel signals based on the electric charge, and at least one first wiring. The imaging device includes a second chip including a second semiconductor substrate including a logic circuit to process the pixel signals; and a second insulating layer including a second multilayer wiring electrically connected to the logic circuit. The second multilayer wiring that includes at least one second wiring. The first chip and the second chip are bonded to one another via at least the at least one first wiring and the at least one second wiring, and, in a plan view, the at least one first wiring and the at least one second wiring overlap with the plurality of vertical signal lines.

In some embodiments the plurality of vertical signal lines may extend in a first direction and may be arranged in the first multilayer wiring at a first regular interval in a second direction perpendicular to the first direction, and the at least one first wiring may be a plurality of first wirings that include first portions extending in the first direction and arranged in the first multilayer wiring at a second regular interval in the second direction.

In some embodiments the first regular interval and the second regular interval may correspond to a pitch between two of the plurality of pixel regions.

In some embodiments the first regular interval may correspond to a pitch between two of the plurality of pixel regions, and the second regular interval may correspond to half of the pitch.

In some embodiments the plurality of first wirings may include a second portion that extends in the second direction.

In some embodiments the at least one second wiring may be a plurality of second wirings that include first portions extending in a first direction, and the at least one first wiring may extend in a second direction that is perpendicular to the first direction.

In some embodiments the at least one second wiring may include second wiring portions for respective ones of the plurality of pixel regions.

According to another embodiment of the present technology, an electronic apparatus comprises an imaging device including a first chip. The first chip includes a first semiconductor substrate including a photoelectric conversion region that converts incident light into electric charge; and a first insulating layer including a first multilayer wiring electrically connected to the photoelectric conversion region. The first multilayer wiring includes a first vertical signal line to output a first pixel signal based on the electric charge, and a first wiring. The imaging device includes a second chip including a second semiconductor substrate including a logic circuit to process the first pixel signal; and a second insulating layer including a second multilayer wiring electrically connected to the logic circuit. The second multilayer wiring includes a second wiring. The first chip and the second chip are bonded to one another via at least the first wiring and the second wiring. In a plan view, the first wiring and the second wiring overlap with at least a portion of the first vertical signal line.

Advantageous Effects of Invention

According to the present technology, a solid state image sensor that can improve bonding strength of semiconductor substrates while suppressing occurrence of voids in a bonded portion of the semiconductor substrates can be provided. Note that effects of the present technology are not limited to the above-described effects, and any of effects described in the present disclosure may be exhibited.

Embodiments of the invention will now be described with reference to the accompanying drawings, throughout which like parts are referred to by like references.

BRIEF DESCRIPTION OF DRAWINGS

FIG. 1 is a block diagram illustrating a configuration example of a solid state image sensor according to an embodiment of the present technology.

FIGS. 2A to 2C are schematic diagrams illustrating a laminate structure of a solid state image sensor according to an embodiment of the present technology.

FIG. 3 is a schematic configuration diagram illustrating principal portions of a first embodiment of a solid state image sensor according to the present technology.

FIG. 4 is an enlarged configuration diagram illustrating principal portions of a first semiconductor substrate of the first embodiment.

FIG. 5 is an enlarged configuration diagram illustrating principal portions of a second semiconductor substrate of the first embodiment.

FIGS. 6A and 6B are enlarged configuration diagrams illustrating a shielding portion of the solid state image sensor of the first embodiment.

FIG. 7 is an enlarged schematic diagram illustrating a pixel unit signal line layout of the first embodiment.

FIG. 8 is a manufacturing process diagram (part 1) illustrating an example of a method of manufacturing the solid state image sensor of the first embodiment.

FIG. 9 is a manufacturing process diagram (part 2) illustrating an example of a method of manufacturing the solid state image sensor of the first embodiment.

FIG. 10 is a manufacturing process diagram (part 3) illustrating an example of a method of manufacturing the solid state image sensor of the first embodiment.

FIG. 11 is a manufacturing process diagram (part 4) illustrating an example of a method of manufacturing the solid state image sensor of the first embodiment.

FIG. 12 is a manufacturing process diagram (part 5) illustrating an example of a method of manufacturing the solid state image sensor of the first embodiment.

FIG. 13 is a manufacturing process diagram (part 6) illustrating an example of a method of manufacturing the solid state image sensor of the first embodiment.

FIG. 14 is a manufacturing process diagram (part 7) illustrating an example of a method of manufacturing the solid state image sensor of the first embodiment.

FIG. 15 is a manufacturing process diagram (part 8) illustrating an example of a method of manufacturing the solid state image sensor of the first embodiment.

FIG. 16 is a manufacturing process diagram (part 9) illustrating an example of a method of manufacturing the solid state image sensor of the first embodiment.

FIGS. 17A and 17B are enlarged configuration diagrams illustrating a shielding portion of a solid state image sensor of a second embodiment.

FIGS. 18A and 18B are enlarged configuration diagrams illustrating a shielding portion of a solid state image sensor of a third embodiment.

FIGS. 19A and 19B are enlarged configuration diagrams illustrating a shielding portion of a solid state image sensor of a fourth embodiment.

FIGS. 20A and 20B are enlarged configuration diagrams illustrating a shielding portion of a solid state image sensor of a fifth embodiment.

FIGS. 21A and 21B are enlarged configuration diagrams illustrating a shielding portion of a solid state image sensor of a sixth embodiment.

FIGS. 22A and 22B are enlarged configuration diagrams illustrating a shielding portion of a solid state image sensor of a seventh embodiment.

FIGS. 23A and 23B are enlarged configuration diagrams illustrating a shielding portion of a solid state image sensor of an eighth embodiment.

FIGS. 24A and 24B are enlarged configuration diagrams illustrating a shielding portion of a solid state image sensor of a ninth embodiment.

FIG. 25 is a schematic configuration diagram illustrating principal portions of a tenth embodiment of a solid state image sensor according to the present technology.

FIG. 26 is a schematic configuration diagram of an electronic device of an eleventh embodiment according to the present technology.

DESCRIPTION OF EMBODIMENTS

Hereinafter, favorable embodiments for implementing the present technology will be described with reference to the drawings. Note that the embodiments described below describe examples of a representative embodiment of the present technology, and the scope of the present technology is not construed in a narrow manner by the embodiments. Further, any one or a plurality of the embodiments described below can be combined. Note that, as for the drawings, the same or equivalent elements or members are denoted with the same sign, and overlapping description is omitted.

Description will be given in the following order.
1. Configuration Example of Solid State Image Sensor
2. Laminate Structure Example of Solid State Image Sensor
3. Solid State Image Sensor of First Embodiment
4. Solid State Image Sensor of Second Embodiment
5. Solid State Image Sensor of Third Embodiment
6. Solid State Image Sensor of Fourth Embodiment
7. Solid State Image Sensor of Fifth Embodiment
8. Solid State Image Sensor of Sixth Embodiment
9. Solid State Image Sensor of Seventh Embodiment
10. Solid State Image Sensor of Eighth Embodiment
11. Solid State Image Sensor of Ninth Embodiment
12. Solid State Image Sensor of Tenth Embodiment
13. Electronic Device of Eleventh Embodiment 1. Configuration Example of Solid State Image Sensor FIG. 1 is a block diagram illustrating a configuration example of a solid state image sensor according to an embodiment of the present technology.

As illustrated in FIG. 1, a solid state image sensor 1 is configured as a complementary metal oxide semiconductor (CMOS) image sensor, for example. The solid state image sensor 1 includes a pixel area (pixel array) 3 in which a plurality of pixels (or pixel regions) 2 is arrayed in a two-dimensional array manner on a semiconductor substrate (for example, an Si substrate) (not illustrated).

The pixel (or pixel region) 2 includes a photoelectric conversion unit(s) (for example, a photodiode) and a plurality of pixel transistors (MOS transistors). The plurality of pixel transistors can be configured from three transistors including a transfer transistor, a reset transistor, and an amplification transistor, for example. Further, the plurality of pixel transistors can also be configured from four transistors by adding a selection transistor. Note that an equivalent circuit of a unit pixel is similar to a known technology, and thus detailed description is omitted.

Further, the pixel 2 can be configured from one unit pixel or can have a pixel sharing structure. The pixel sharing structure is a structure in which a plurality of photodiodes shares transistors other than a floating diffusion and a plurality of transfer transistors. That is, in the pixel sharing, the photodiodes and the transfer transistors that configure a plurality of unit pixels share one other pixel transistors.

A peripheral circuit portion includes a vertical drive circuit 4, a column signal processing circuit 5, a horizontal drive circuit 6, an output circuit 7, and a control circuit 8.

The vertical drive circuit 4 is configured from a shift resistor, for example. The vertical drive circuit 4 selects pixel drive wiring, supplies a pulse for driving pixels to the selected pixel drive wiring, and drives the pixels in row units. That is, the vertical drive circuit 4 sequentially selects and scans the pixels 2 in the pixel array 3 in row units in a vertical direction. Then the vertical drive circuit 4 supplies, to the column signal processing circuit 5, a pixel signal based on a signal charge generated according to a received light amount in the photoelectric conversion unit in each of the pixels 2, through a vertical signal line (VSL) 9.

The column signal processing circuit 5 is arranged in every column of the pixels 2, for example. The column signal processing circuit 5 performs signal processing such as noise removal for the signals output from the pixels 2 of one row in every pixel column. To be specific, the column signal processing circuit 5 performs signal processing such as correlated double sampling (CDS) for removing a fixed pattern noise unique to the pixels 2, signal amplification, analog/digital (A/D) conversion. A horizontal selection switch (not illustrated) is connected and provided between an output stage of the column signal processing circuit 5 and a horizontal signal line 10.

The horizontal drive circuit 6 is configured from a shift resistor, for example. The horizontal drive circuit 6 sequentially outputs horizontal scanning pulses to sequentially select the column signal processing circuits 5, and outputs the pixel signals from the respective column signal processing circuits 5 to the horizontal signal line 10.

The output circuit 7 performs signal processing for the signals sequentially supplied from the column signal processing circuits 5 through the horizontal signal line 10, and outputs the signals. The output circuit 7 may perform buffering only or may perform various types of digital signal processing such as black level adjustment and column variation correction.

The control circuit 8 receives an input clock and data that instructs an operation mode and the like, and outputs data of internal information and the like of the solid state image sensor 1. Further, the control circuit 8 generates clock signals and control signals serving as references of operations of the vertical drive circuit 4, the column signal processing circuit 5, the horizontal drive circuit 6, and the like on the basis of a vertical synchronization signal, a horizontal synchronization signal, and a master clock. The control circuit 8 then inputs the signals to the vertical drive circuit 4, the column signal processing circuit 5, the horizontal drive circuit 6, and the like.

An input/output terminal 12 exchanges signals with an outside.

2. Laminate Structure Examples of Solid State Image Sensor

FIGS. 2A to 2C are schematic diagrams illustrating laminate structure examples of a solid state image sensor according to an embodiment of the present technology. Laminate structure examples of a solid state image sensor to which the present technology is applied will be described using FIGS. 2A to 2C.

As a first example, a solid state image sensor 1a illustrated in FIG. 2A is configured from a first semiconductor substrate 21 and a second semiconductor substrate 22. A pixel array 23 and a control circuit 24 are mounted on the first semiconductor substrate 21. A logic circuit 25 including a signal processing circuit is mounted on the second semiconductor substrate 22. Then, the first semiconductor substrate 21 and the second semiconductor substrate 22 are electrically connected with each other to configure the solid state image sensor 1a as one semiconductor substrate.

As a second example, a solid state image sensor 1b illustrated in FIG. 2B is configured from a first semiconductor substrate 21 and a second semiconductor substrate 22. A pixel array 23 is mounted on the first semiconductor substrate 21. A control circuit 24 and a logic circuit 25 including a signal processing circuit are mounted on a second semiconductor substrate 22. Then, the first semiconductor substrate 21 and the second semiconductor substrate 22 are electrically connected with each other to configure the solid state image sensor 1b as one semiconductor substrate.

As a third example, a solid state image sensor 1c illustrated in FIG. 2C is configured from a first semiconductor substrate 21 and a second semiconductor substrate 22. A pixel array 23 and a control circuit 24-1 that controls the pixel array 23 are mounted on the first semiconductor substrate 21. A control circuit 24-2 that controls a logic circuit 25 including a signal processing circuit and the logic circuit 25 are mounted on the second semiconductor substrate 22. Then, the first semiconductor substrate 21 and the second semiconductor substrate 22 are electrically connected with each other to configure the solid state image sensor 1c as one semiconductor substrate.

Although not illustrated, a CMOS solid state image sensor may be configured from two or more bonded semiconductor substrates depending on a configuration. For example, a semiconductor substrate including a memory element array or a semiconductor substrate including another circuit element can be added to the first and second semiconductor substrates to bond the three or more semiconductor substrates to configure a CMOS solid state image sensor as one substrate.

Configuration Example of Solid State Image Sensor

3. Solid State Image Sensor of First Embodiment

FIG. 3 illustrates a first embodiment of a solid state image sensor according to the present technology, that is, a back illuminated CMOS solid state image sensor. The back illuminated CMOS solid state image sensor is a CMOS solid state image sensor having a light-receiving portion arranged above a circuit portion and having higher sensitivity and lower noises than a surface illuminated CMOS solid state image sensor. A solid state image sensor 31 according to the first embodiment is configured from a laminated semiconductor substrate 32 in which a first semiconductor substrate (or first chip) 26 on which a pixel array (or pixel regions) 34 and a control circuit (not illustrated) are formed, and a second semiconductor substrate (or second chip) 28 on which a logic circuit 55 is formed are bonded with each other, which is similar to the solid state image sensor 1a in FIG. 2A. The first semiconductor substrate 26 and the second semiconductor substrate 28 are bonded with each other in such a manner that mutual multilayer wiring layers described below face each other, and connection wiring is directly bonded.

In the first semiconductor substrate 26, a pixel array 34 is formed on a first semiconductor substrate 33 made of silicon formed into a thin film, the pixel array 34 having a plurality of pixels arrayed in a two-dimensional column manner, the each of the pixels including a photodiode PD serving as a photoelectric conversion unit and a plurality of pixel transistors Tr1 and Tr2. Further, a plurality of MOS transistors that configures a control circuit is formed on the semiconductor substrate 33 although not illustrated. On a surface 33a side of the semiconductor substrate 33, a multilayer wiring layer 37 in which wiring 35 (35a to 35d) made of a plurality of, in this example, four layers of metal M1 to M4, and wiring 36 are arranged is formed through an interlayer insulating film 53 that is a first insulating film. As the wiring 35 and the wiring 36, copper (Cu) wiring formed by a dual damascene method is used. On a back surface side of the semiconductor substrate 33, a light-shielding film 39 is formed to include an optical black region 41 through an insulating film 38, and a color filter 44 and an on-semiconductor substrate lens 45 are formed on an effective pixel array 42 through a flattened film 43. The on-semiconductor substrate lens 45 can be formed on the optical black region 41 as well.

In FIG. 3, the pixel transistors Tr1 and Tr2 are illustrated as representatives of the plurality of pixel transistors. FIG. 3 schematically illustrates pixels of the pixel array 34, and FIG. 4 illustrates details of one pixel. In the first semiconductor substrate 26, the photodiode PD is formed on the semiconductor substrate 33 formed into a thin film. The photodiode PD includes, for example, an n-type semiconductor region 46 and a P-type semiconductor region 47 on a substrate surface side. A P-type semiconductor region 48 is formed on a substrate surface that configures a pixel, through a gate insulating film, and the gate electrode 48 and a source/drain region 49 that makes a pair with the gate electrode 48 form the pixel transistors Tr1 and Tr2. The pixel transistor Tr1 adjacent to the photodiode PD corresponds to a floating diffusion FD. Unit pixels are separated in an element separation region 51. The element separation region 51 is formed to have a shallow trench isolation (STI) structure having an insulating film such as an $SiO_2$ film embedded in a groove formed in a substrate, for example.

In the multilayer wiring layer 37 of the first semiconductor substrate 26, a corresponding pixel transistor and the wiring 35, and adjacent upper and lower layers of the wiring 35 are connected through a conductive via 52. Further, connection wiring 36 made of the fourth layer of metal M4 is formed to face a bonding surface 40 between the first semiconductor substrate 26 and the second semiconductor substrate 28. The connection wiring 36 is connected with necessary wiring 35d made of the third layer of metal M3 through the conductive via 52. Further, a vertical signal line VSL1 is formed in the third layer. The bonding surface 40 may include a first connection region for the multilayer wiring layer 37 that includes a first wiring 71, and a second connection region for the multilayer wiring layer 59 that includes a second wiring 72. The first chip 26 and the second chip 28 are bonded to one another by at least the first and second wirings 71 and 72.

In the second semiconductor substrate 28, a logic circuit 55 that configures a peripheral circuit is formed in regions serving as semiconductor substrates of a second semiconductor substrate 54 made of silicon. The logic circuit 55 is formed of a plurality of MOS transistors Tr11 to Tr14 including a CMOS transistor. On a surface side of the second semiconductor substrate 54, illustrated in FIG. 5, a multilayer wiring layer 59 in which wiring 57 (57a to 57c) made of a plurality of, in this example, four layers of metal M11 to M14, and wiring 58 are arranged is formed through an interlayer insulating film 56 that is a second insulating film. As the wiring 57 and the wiring 58, copper (Cu) wiring formed by a dual damascene method is used.

FIG. 3 illustrates the MOS transistors Tr11 to Tr14 as representatives of the plurality of MOS transistors of the logic circuit 55. FIG. 3 schematically illustrates the MOS transistors Tr11 to Tr14 and FIG. 5 illustrates details of the MOS transistors Tr11 and Tr12, for example. In the second semiconductor substrate 28, the MOS transistors Tr11 and Tr12 are formed including a pair of source/drain regions 61 and gate electrodes 62 through a gate insulating film in a semiconductor well region on a surface side of the second semiconductor substrate 54. The MOS transistors Tr11 and Tr12 are separated in an element separation region 63 having a STI structure, for example.

In the multilayer wiring layer 59 of the second semiconductor substrate 28, the MOS transistors Tr11 to Tr14 and the wiring 57, and adjacent upper and lower layers of the wiring 57 are connected through a conductive via 64. Further, connection wiring 58 made of the fourth layer of metal M14 is formed to face the bonding surface 40 between the first semiconductor substrate 26 and the second semiconductor substrate 28. The connection wiring 58 is connected with necessary wiring 57c made of the third layer of metal M13 through the conductive via 64.

The first semiconductor substrate 26 and the second semiconductor substrate 28 are electrically connected with each other by directly bonding the connection wiring 36 and the connection wiring 58 that face the bonding surface 40 in such a manner that mutual multilayer wiring layers 37 and 59 face each other. An interlayer insulating film 66 near the bonding is formed by a combination of a Cu diffusion barrier insulating film for preventing (or alternatively, reducing) Cu diffusion of the Cu wiring and an insulating film not having Cu diffusion properties, as described in a manufacturing method below. The direct bonding of the connection wiring 36 and the connection wiring 58 with Cu wiring is performed by thermal diffusion bonding. Bonding of the interlayer insulating films 66 other than the connection wiring 36 and the connection wiring 58 is performed by plasma bonding or with an adhesive.

As described above, a method of forming an extremely thin uniform insulating thin film 900 on the multilayer wiring layers 37 and 59 and bonding the layers by plasma bonding or the like is also employable, other than the method of directly bonding the connection wiring 36 and the connection wiring 58 that face the bonding surface 40. Note that the insulating thin film 900 is not illustrated in FIG. 3.

Then, in the present embodiment, a shielding layer 68 with a potential clamped by a conductive film in the same layer as the connection wiring is especially formed near the bonding of the first semiconductor substrate 26 and the second semiconductor substrate 28, as illustrated in FIG. 3. The shielding layer 68 of the present embodiment is formed in such a manner that a shielding portion (first conductor or first wiring) 71 made of the metal M4 in the same layer as the connection wiring 36 on the first semiconductor substrate 26 side and a shielding portion (second conductor or second wiring) 72 made of the metal M14 in the same layer as the connection wiring 58 on the second semiconductor substrate 28 side overlap with each other.

FIG. 6A is an enlarged configuration diagram illustrating the shielding portion 71 of the first semiconductor substrate 26 of the present embodiment. FIG. 6B is an enlarged configuration diagram illustrating the shielding portion 72 of the second semiconductor substrate 28 of the present embodiment. A layout of the shielding portions 71 and 72 of the present technology will be described using FIGS. 6A and 6B.

As illustrated in FIG. 6A, the shielding portion 71 of the present embodiment is formed in a layout in which a plurality of vertical stripe shapes is arrayed in accordance with an arrangement interval of bundles of vertical signal lines M3 or an FD pitch of pixel units, and a horizontal stripe shape is arranged in a direction perpendicular to the plurality of vertical stripe shapes. The bundle of the vertical signal lines M3 is formed of four vertical signal lines, as an example. The shielding portion 71 of the present embodiment is arranged in a direction of the bonding surface 40 above the bundles of the vertical signal lines M3 of an analog circuit to cover a part or all of the vertical signal lines M3. Note that the vertical stripe shape and the horizontal stripe shape of the shielding portion 71 of the present embodiment are perpendicular to each other. However, the directions are not limited to the perpendicular directions as long as the directions intersect with each other. Further, as illustrated in FIG. 6B, the shielding portion 72 of the present embodiment is formed in a layout in which the interlayer insulating film 66 is included at a position overlapping with the shielding portion 71 as viewed from the top and a horizontal stripe shape is arranged at a position overlapping with the horizontal stripe shape of the shielding portion 71. According to at least one embodiment, the FD pitch is a pitch between floating diffusions of respective photoelectric conversion regions in the pixel units (e.g., from one center of a floating diffusion to a center of a neighboring floating diffusion). According to at least one embodiment, the FD pitch is a pitch between respective pixel units (e.g., between edges of respective pixel units), where each pixel unit includes multiple pixels that share a floating diffusion (e.g., 2×2 pixels, 2×4 pixels, 4×2 pixels, etc). According to at least one example embodiment, the FD pitch is a pitch between photodiodes of two pixels or pixel units.

As the shielding portions 71 and 72 of the present embodiment, copper (Cu) is used as the first and second conductors, as an example. In the present embodiment, a surface occupancy ratio (area ratio) of Cu of the first conductor is 40 to 70%, and a surface occupancy ratio of Cu of the second conductor is 0 to 30%. Here, the "surface occupancy ratio" refers to a ratio of a surface area of a shielding portion to a surface area of one pixel unit.

FIG. 7 is an enlarged diagram illustrating a signal line layout of the pixel array of the solid state image sensor of the present embodiment. In the pixel array 23 of the present embodiment, a plurality of photodiodes is vertically and horizontally arrayed in parallel. A plurality of reset signal lines M21, transfer signal lines M22, and pixel selection signal lines M23 are arrayed in the pixel array 23 in parallel at predetermined pitched in a horizontal direction. Further, the plurality of vertical signal lines M3 is arrayed in the pixel array 23 at predetermined pitches in a vertical direction.

The shielding layer 68 favorably has potential clamp. For example, a ground potential is applied and the shielding layer 68 is potentially stabilized. The potential clamp can be performed on the first semiconductor substrate 33 side or on the second semiconductor substrate 54 side, or on both the first semiconductor substrate 33 and the second semiconductor substrate 54. As a method of the potential clamp, there is a method of being connected with a reference voltage VSS on a lower voltage side, for example. As an example, there is a method of connecting a horizontal signal line that supplies a source voltage and a shielding layer, using a multilayer wiring technology. Positions of connection are favorably in the pixel array 34. However, the positions of connection may be outside the pixel array 34. Note that, in the shielding portion 71 as the first conductor and the shielding portion 72 as the second conductor, the size of a planar shape that covers the pixel array 34 is favorably the size of a planar shape of the pixel array 34 or more.

Example of Method of Manufacturing Solid State Image Sensor

An example of a method of manufacturing the solid state image sensor 31 according to the first embodiment will be described in FIGS. 8 to 16. FIGS. 8 to 10 illustrate processes on the first semiconductor substrate 26 side including the pixel array 34, FIGS. 11 to 13 illustrate processes on the second semiconductor substrate 28 side including the logic circuit 55, and FIGS. 14 to 16 illustrate processes on and after bonding.

First, as illustrated in FIG. 8, a semiconductor well region 30 is formed in a region serving as semiconductor substrates of the first semiconductor wafer (hereinafter, referred to as semiconductor substrate) 33 made of silicon, and the photodiodes PD serving as photoelectric conversion units of pixels are formed in the semiconductor well region 30. Although not illustrated, the element separation region 51 (see FIG. 4) can be first formed. The photodiodes PD are formed being extended in a depth direction of the semiconductor well region 30. The photodiodes PD are formed in the effective pixel array 42 and the optical black region 41 that configure the pixel array 34.

Further, a plurality of pixel transistors that configures the pixels is formed on the surface 33a side of the semiconductor well region 30. The pixel transistors can be configured from a transfer transistor, a reset transistor, and an amplification transistor, for example. Here, as described above, the pixel transistors Tr1 and Tr2 are illustrated as representatives. The pixel transistors Tr1 and Tr2 are formed including a pair of source/drain regions, and a gate electrode formed through a gate insulating film, although not illustrated.

The wiring 35 (35a, 35b, 35c, and 35d) made of three layers of metal M1 to M3 in this example are formed including the conductive via 52 in an upper portion on the surface 33a side of the semiconductor substrate 33 through the interlayer insulating film 53. The wiring 35 can be formed by a dual damascene method. That is, a connection hole by via first and a wiring groove are formed in the interlayer insulating film 53 at the same time, then a Cu diffusion barrier metal film for preventing (or alternatively, reducing) Cu diffusion and a Cu seed film are formed, and then a Cu material layer is embedded by plating. Examples of the Cu diffusion barrier metal film include films made of Ta, TaN, Ti, TiN, W, WN, Ru, and TiZrN, and alloy films containing the aforementioned metal. Next, an excessive Cu material layer is removed by a chemical-mechanical planarization (CMP) method, and Cu wiring integrated with a flattened conductive via is formed. After that, a Cu diffusion barrier insulating film is formed although not illustrated. As the Cu barrier insulating film, an insulating film made of SiN, SiC, SiCN, or SiON can be used, for example. By repeating the processes, the wiring 35a to 35d made of the three layers of metal M1 to M3 is formed.

Next, as illustrated in FIG. 9, a first insulating film 76 not having Cu diffusion barrier properties, a second insulating film 77 not having Cu diffusion barrier properties, and a Cu diffusion barrier insulating film 75 are sequentially formed. The first insulating film 76 and the second insulating film 77 are formed of an SiO2 film or an SiCOH film. Further, as the Cu barrier insulating film 75, an insulating film made of SiN, SiC, SiCN, or SiON can be used, similarly to the above description, for example. The Cu diffusion barrier insulating film 75, the first insulating film 76, and the second insulating film 77 correspond to the interlayer insulating film 53. Next, the Cu diffusion barrier insulating film 75 on the uppermost surface, the first insulating film 76, and the second insulating film 77 are patterned and a via hole 80 is selectively formed as an opening portion, by via first using lithography and etching technologies. After that, the second insulating film 77 portion is patterned and an opening portion 78 is selectively formed. That is, patterning is performed to include the opening portion 78 corresponding to the shielding portion 71 to be formed, and an opening portion 79 and the via hole 80 corresponding to the connection wiring 36 to be formed.

Next, as illustrated in FIG. 10, the shielding portion 71 including an opening portion, and the conductive via 52 and the connection wiring 36 connected to the wiring 35d are formed in such a manner that the Cu material is embedded in the opening portions 78 and 79 and the via hole 80, using a dual damascene method, similarly to the above description. The shielding portion 71 and the connection wiring 36 are formed of the fourth layer of metal M4. With the processes, the multilayer wiring layer 37 is formed of the wiring 35a to 35d made of the metal M1 to M4, the connection wiring 36, the shielding portion 71, the interlayer insulating film 53, and the insulating films 75 to 77. Here, the wiring 35d made of the fourth layer of metal M4 connected to the connection wiring 36 is favorably formed to be sufficiently extended to the shielding portion 71 side and to have an area overlapping with the shielding portion 71 so that emission light from the logic circuit side is not leaked to the photodiode PD side.

Further, the extremely thin uniform insulating thin film 900 is formed on the shielding portion 71 and the connection wiring 36.

Meanwhile, as illustrated in FIG. 11, a semiconductor well region 50 is formed in a region serving as semiconductor substrates of the second semiconductor wafer (hereinafter, referred to as semiconductor substrate) 54 made of silicon. The plurality of MOS transistors Tr11 to Tr14 that configure the logic circuit 55 is formed in the semiconductor well region 50. Here, as described above, the MOS transistors Tr11 to Tr14 are illustrated as representatives. Although not illustrated, the element separation region 63 (see FIG. 5) can be first formed.

The wiring 57 (57a, 57b, and 57c) made of three layers of metal M11 to M13 in this example is formed including the conductive via 64 in an upper portion on the surface side of the semiconductor substrate 54 through the interlayer insulating film 56. The wiring 57 can be formed by a dual damascene method. That is, a connection hole by via first and a wiring groove are formed in the interlayer insulating film at the same time, then a Cu diffusion barrier metal film for preventing (or alternatively, reducing) Cu diffusion and a Cu seed film are formed, and then a Cu material layer is embedded by plating. Examples of the Cu diffusion barrier metal film include films made of Ta, TaN, Ti, TiN, W, WN, Ru, and TiZrN, and alloy films containing the aforementioned metal. Next, an excessive Cu material layer is removed by a chemical-mechanical planarization (CMP) method, and Cu wiring integrated with a flattened conductive via is formed. After that, a Cu diffusion barrier insulating film is formed although not illustrated. As the Cu barrier insulating film, an insulating film made of SiN, SiC, SiCN, or SiON can be used, for example. By repeating the processes, the wiring 57a to 57c made of the three layers of metal M11 to M13 is formed.

Next, as illustrated in FIG. 12, a first insulating film 82 not having Cu diffusion barrier properties, a second insulating film 83 not having Cu diffusion barrier properties, and a Cu diffusion barrier insulating film 81 are sequentially formed. The first insulating film 82 and the second insulating film 83 are formed of an SiO2 film or an SiCOH film. Further, as the Cu barrier insulating film 81, an insulating film made of SiN, SiC, SiCN, or SiON can be used, similarly to the above description, for example. The Cu diffusion barrier insulating film 81, the first insulating film 82, and the second insulating film 83 correspond to the interlayer insulating film. Next, the Cu diffusion barrier insulating film 81 on the uppermost surface, the first insulating film 82, and the second insulating film 83 are patterned and a via hole 86 is selectively formed as an opening portion, by via first using lithography and etching technologies. After that, the second insulating film 83 portion is patterned and opening portions 84 and 85 are selectively formed.

Next, as illustrated in FIG. 13, the shielding portion 72, and the conductive via 64 and the connection wiring 58 connected to the wiring 57c are formed in such a manner that the Cu material is embedded in the opening portions 84 and 85 and the via hole 86, using a dual damascene method, similarly to the above description. The shielding portion 72 and the connection wiring 58 are formed of the fourth layer of metal M14. With the processes, the multilayer wiring layer 59 is formed of the wiring 57a to 57c made of the metal M11 to M13, the connection wiring 58, the shielding portion 72, the interlayer insulating film 56, and the insulating films 81 to 83.

Further, an extremely thin uniform insulating thin film 901 is formed on the shielding portion 72 and the connection wiring 58.

Next, as illustrated in FIG. 14, the first semiconductor substrate 33 and the second semiconductor substrate 54 are bonded in such a manner that the mutual multilayer wiring layers face each other, the connection wiring 36 and the connection wiring 58 are directly in contact with each other and are electrically connected. That is, the first and second semiconductor substrates 33 and 54 are physically bonded and are electrically connected. At this time, the shielding portion 71 and the shielding portion 72 are directly bonded in an overlapping portion. That is, the connection wiring 36 and the connection wiring 58, and the shielding portions 71 and 72 are thermally diffusion bonded by thermal treatment.

The thermal treatment temperature at this time can be about 100 to 500° C. Further, the insulating films that are the interlayer insulating films are plasma bonded by surface treatment. Note that the insulating films that are the interlayer insulating films can be bonded with an adhesive.

As described above, the first conductor of the shielding portion 71 and the second conductor of the shielding portion 72 can first have an insulating film interposed in the bonding surface 40, and then heat is applied, so that copper as a conductor is crystal grown to connect the first and second conductors near the bonding surface 40. Therefore, the first conductor and the second conductor are respectively arranged on the bonding surface 40 sides with respect to the first semiconductor substrate 26, and to the logic circuit 55 and the wiring 35 formed in the second semiconductor substrate.

Next, as illustrated in FIG. 15, the first semiconductor substrate 33 is ground and polished and is formed into a thin film to leave a necessary film thickness of the photodiodes PD, from the back surface side, using a CMP method or the like.

Next, as illustrated in FIG. 16, the light-shielding film 39 is formed to include the photodiodes PD corresponding to an optical black region, on the thin film surface through the insulating film 38. Further, the color filter 44 and the on-semiconductor substrate lens 45 are formed on the photodiodes PD corresponding to the effective pixel array through the flattened film 43.

Next, making semiconductor substrates is performed in which the bonded first semiconductor substrate 33 and second semiconductor substrate 54 are separated, to obtain the objective solid state image sensor 31 illustrated in FIG. 16.

As the shielding portions 71 and 72, the connection wiring 36 and 58, and the metal M4 and M14 in the same layer as the aforementioned portions and wiring, a material having high conductivity, high shielding properties, and easily bonded is desirably used. As a material having such properties, a single material of Al, W, Ti, Ta, Mo, or Ru, or an alloy can be used other than Cu.

The film thickness of the shielding layer 68, in the present example, the film thicknesses of the shielding portions 71 and 72 are desirably determined according to a wavelength of light on the emitted second semiconductor substrate 28 side. In the present embodiment, light emission from hot carrier of the MOS transistor of the second semiconductor substrate 28 needs to be shielded. Therefore, the shielding film thickness needs to be designed for the light having a wavelength of about 1 μm. For example, the film thickness of the shielding layer 68, that is, the film thicknesses of the shielding portion 71 and 72, can be about 50 to 800 nm.

According to the solid state image sensor 31 and the method of manufacturing the same according to the present embodiment, a light-shielding layer and the shielding layer (shield layer) 68 against electrical noises are formed only with the first conductor 71 and the second conductor 72 near the bonding surface 40 of the first semiconductor substrate 26 and the second semiconductor substrate 28. Further, near the bonding surface 40, the area ratio of the area in contact with the bonding surface 40 is higher in the first conductor 71 than in the second conductor 72, and the area ratios are asymmetrical. Therefore, according to the solid state image sensor 31 and the method of manufacturing the same, wafer bonding of conductive films having the high area ratios can be realized and generation of voids in the bonding surface 40 can be suppressed. Further, the suppression of generation of voids in the bonding surface 40 can provide the solid state image sensor 31 with improved image quality. Note that the area ratio of the area in contact with the bonding surface 40 may be higher in the second conductor 72 than in the first conductor 71 as long as the area ratios are different and asymmetrical between the first and second conductors 71 and 72. A reason of generation of a region where bonding is not performed is that a bonding-wave speed at the time of wafer to wafer bonding becomes nonuniform due to a high area ratio of a copper electrode, and as a result, a relatively lower bonding speed occurs in a portion in a wafer peripheral portion, and the region where bonding is not performed, that is, a void is formed. If the area ratios of the first conductor 71 and the second conductor 72 are symmetrical, the area ratios of the conductors become high on both the upper substrate side and the lower substrate side. In this case, the nonuniformity of the bonding-wave speed occurs. Meanwhile, if the area ratios are made asymmetrical to decrease the area ratio of one of the conductors, the nonuniformity of the bonding-wave speed is resolved and generation of voids can be suppressed. When the generation of voids is suppressed and the shielding layer 68 is formed, noises can be cut off, and thus the image quality can be improved.

Note that, near the bonding surface 40, a dummy conductor may be arranged in place of the first or second conductor 71 or 72. In the manufacturing process, when flattening a surface including a dummy by a CMP device, flatness can be secured by arranging the dummy conductor. Further, the plurality of first and second conductors 71 and 72 may be arranged to cover 30% or more of the vertical signal lines, or may be favorably arranged to cover 50% or more of the vertical signal lines. Bonding strength of semiconductor substrates can be improved while occurrence of voids in a bonded portion of the semiconductor substrates can be suppressed, by covering the vertical signal lines at the above-described ratios. With the configuration, deterioration of the image quality can be prevented (or alternatively, reduced).

If the area ratios of both the first and second conductors 71 and 72 are made high, the bonding-wave speed at the time of wafer to wafer bonding becomes nonuniform, and as a result, a relatively lower bonding speed occurs in a portion in a wafer peripheral portion, and the region where bonding is not performed, that is, a void is formed. Therefore, to make the ratio of the conductor of the bonding surface high, the ratio of the other conductor needs to be decreased. Here, changing the occupancy ratios of the upper and lower conductors is expressed as making asymmetrical. Further, to enhance the bonding strength, a region where the insulating film and the insulating film are bonded needs to be secured to some extent.

The surface occupancy ratio (area ratio) of the conductor having a larger area in contact with the bonding surface needs to be set to 30 to 90%. Further, it is effective to set the surface occupancy ratio of the conductor having a smaller area in contact with the bonding surface to 0 to 50%. Desirably, if the surface occupancy ratio of the conductor having a larger area is set to 40 to 70%, and the surface occupancy ratio of the conductor having a smaller area is set to 0 to 30%, the generation of voids at the time of bonding can be more effectively suppressed. Further, it is optimum (or desired) to set the surface occupancy ratio of the conductor having a larger ratio to 55%.

Further, the length of the width of the conductor at this time is desirably set to 10 um or less. Desirably, if the length of the width of the conductor is set to 1 um or less, the generation of voids at the time of bonding can be more effectively suppressed.

Further, according to the solid state image sensor 31 and the method of manufacturing the same according to the present embodiment, the shielding layer 68 made of the metal M4 and M14 in the same layer as the connection wiring 36 and 58 is formed near the bonding of the first semiconductor substrate 26 and the second semiconductor substrate 28. With the shielding layer 68, entering of the light emission due to hot carrier from the MOS transistor of the logic circuit 55 of the second semiconductor substrate 28 toward the first semiconductor substrate 26 side can be suppressed. Therefore, a bad influence of the light emission due to hot carrier is suppressed. Therefore, dark currents and random noises can be suppressed.

Further, according to the solid state image sensor 31 and the method of manufacturing the same according to the present embodiment, the shielding layer 68 is formed of the metal M4 and M14 in the same layer as the connection wiring 36 and 58. Therefore, the thickness of the entire bonded semiconductor substrates can be made smaller than conventional technologies, and the solid state image sensor 31 can be formed into a thinner film. With the configuration, the solid state image sensor 31 with small dark currents and random noises can be provided without increasing the thickness of the entire semiconductor substrate.

Further, according to the solid state image sensor 31 and the method of manufacturing the same according to the present embodiment, the wiring, the connection wiring, and the shielding layer can be formed at the same time. Therefore, reduction of manufacturing steps, reduction of a mask process, and reduction of material cost can be achieved, and a solid state image sensor with small dark currents and random noises can be manufactured at low cost.

4. Solid State Image Sensor of Second Embodiment

FIG. 17A is an enlarged configuration diagram illustrating a shielding portion 71 of a first semiconductor substrate 26 of a second embodiment. FIG. 17B is an enlarged configuration diagram illustrating a shielding portion 72 of a second semiconductor substrate 28 of the second embodiment. The second embodiment of a solid state image sensor according to an embodiment of the present technology will be described using FIGS. 17A and 17B.

A different point of the present embodiment from the first embodiment in FIGS. 6A and 6B is that a plurality of vertical stripe shapes of the shielding portion 71 in the first semiconductor substrate 26 is arrayed between bundles of adjacent vertical signal lines M3 or between FDs of pixel units. A solid state image sensor 31 of the present embodiment has similar effects to the solid state image sensor 31 of the first embodiment. Further, in the solid state image sensor 31 of the present embodiment, the shielding portion 71 is formed into the plurality of stripe shapes, whereby the width of one stripe can be made narrow. Therefore, generation of bonding voids can be further suppressed.

5. Solid State Image Sensor of Third Embodiment

FIG. 18A is an enlarged configuration diagram illustrating a shielding portion 71 of a first semiconductor substrate 26 of a third embodiment. FIG. 18B is an enlarged configuration diagram illustrating a shielding portion 72 of a second semiconductor substrate 28 of the third embodiment. The third embodiment of a solid state image sensor according to the present technology will be described using FIGS. 18A and 18B.

A different point of the present embodiment from the first embodiment in FIGS. 6A and 6B is that a plurality of vertical stripe shapes of the shielding portion 71 in the first semiconductor substrate 26 is arrayed between bundles of adjacent vertical signal lines M3 or between FDs of pixel units, similarly to the second embodiment. A further different point of the present embodiment from the first embodiment in FIGS. 6A and 6B is that no horizontal stripe shape is formed in the shielding portion 71 in the first semiconductor substrate 26. A solid state image sensor 31 of the present embodiment has similar effects to the solid state image sensor 31 of the first embodiment. Further, the solid state image sensor 31 of the present embodiment can decrease a surface occupancy ratio of the shielding portion 71, as compared with the shielding portion 71 of the first semiconductor substrate 26 of the second embodiment. Therefore, generation of bonding voids can be further suppressed.

6. Solid State Image Sensor of Fourth Embodiment

FIG. 19A is an enlarged configuration diagram illustrating a shielding portion 71 of a first semiconductor substrate 26 of a fourth embodiment. FIG. 19B is an enlarged configuration diagram illustrating a shielding portion 72 of a second semiconductor substrate 28 of the fourth embodiment. The fourth embodiment of a solid state image sensor according to the present technology will be described using FIGS. 19A and 19B.

A different point of the present embodiment from the first embodiment in FIGS. 6A and 6B is that a plurality of vertical stripe shapes of the shielding portion 71 in the first semiconductor substrate 26 is not formed. Further different points of the present embodiment from the first embodiment in FIGS. 6A and 6B are that no horizontal stripe shape is formed in the shielding portion 72 in the second semiconductor substrate 28, and vertical stripe shapes similar to the second embodiment in FIG. 17A are formed in the shielding portion 72. In the present embodiment, an upper surface of the first semiconductor substrate 26 in FIG. 19A and an upper surface of the second semiconductor substrate 28 in FIG. 19B are bonded in a face-to-face manner to manufacture a solid state image sensor 31. At this time, the shielding portion 71 and the shielding portion 72 are bonded, and a mesh shielding layer 68 conductor is eventually formed. Therefore, the shielding portion 71 and the shielding portion 72 being in contact with each other have the same potential after bonding of a wafer. The solid state image sensor 31 of the present embodiment has similar effects to the solid state image sensor 31 of the first embodiment.

7. Solid State Image Sensor of Fifth Embodiment

FIG. 20A is an enlarged configuration diagram illustrating a shielding portion 71 of a first semiconductor substrate 26 of a fifth embodiment. FIG. 20B is an enlarged configuration diagram illustrating a shielding portion 72 of a second semiconductor substrate 28 of the fifth embodiment. The fifth embodiment of a solid state image sensor according to the present technology will be described using FIGS. 20A and 20B.

The shielding portion 71 in the first semiconductor substrate 26 of the present embodiment has a similar configuration to the shielding portion 71 of the second embodiment in FIG. 17A. Meanwhile, the shielding portion 72 in the second semiconductor substrate 28 of the present embodiment is different from the shielding portion 72 of the second embodiment in FIG. 17B in that rectangular (including square) shapes are formed near centers of pixel units in a dot manner. A solid state image sensor 31 of the present embodiment is formed with a low area ratio of the shielding portion 72, and thus can further improve bonding strength of the semiconductor substrates than the solid state image sensors 31 of the first to fourth embodiments.

8. Solid State Image Sensor of Sixth Embodiment

FIG. 21A is an enlarged configuration diagram illustrating a shielding portion 71 of a first semiconductor substrate 26 of a sixth embodiment. FIG. 21B is an enlarged configuration diagram illustrating a shielding portion 72 of a second semiconductor substrate 28 of the sixth embodiment. The sixth embodiment of a solid state image sensor according to the present technology will be described using FIGS. 21A and 21B.

As illustrated in FIG. 21A, the shielding portion 71 of the present embodiment is formed in a layout in which a plurality of horizontal stripe shapes is arrayed at predetermined pitches in a direction perpendicular to bundles of vertical signal lines M3. Further, as illustrated in FIG. 21B, the shielding portion 72 of the present embodiment is formed in a layout in which a vertical stripe shape is arrayed at a position that covers the bundle of the vertical signal lines M3 when the first semiconductor substrate 26 and the second semiconductor substrate 28 are bonded. The solid state image sensor 31 of the present embodiment has similar effects to the solid state image sensor 31 of the first embodiment.

9. Solid State Image Sensor of Seventh Embodiment

FIG. 22A is an enlarged configuration diagram illustrating a shielding portion 71 of a first semiconductor substrate 26 of a seventh embodiment. FIG. 22B is an enlarged configuration diagram illustrating a shielding portion 72 of a second semiconductor substrate 28 of the seventh embodiment. The seventh embodiment of a solid state image sensor according to the present technology will be described using FIGS. 22A and 22B.

As illustrated in FIG. 22A, the shielding portion 71 of the present embodiment is formed in a layout in which a plurality of horizontal stripe shapes is arrayed at predetermined pitches in a direction perpendicular to bundles of vertical signal lines M3, similarly to the sixth embodiment in FIG. 21A. Further, as illustrated in FIG. 21B, the shielding portion 72 of the present embodiment is formed in a layout in which a plurality of rectangular (including square) shapes is randomly arranged on a surface of the second semiconductor substrate 28. The solid state image sensor 31 of the present embodiment has similar effects to the solid state image sensor 31 of the first embodiment.

10. Solid State Image Sensor of Eighth Embodiment

FIG. 23A is an enlarged configuration diagram illustrating a shielding portion 71 of a first semiconductor substrate 26 of an eighth embodiment. FIG. 23B is an enlarged configuration diagram illustrating a shielding portion 72 of a second semiconductor substrate 28 of the eighth embodiment. The eighth embodiment of a solid state image sensor according to the present technology will be described using FIGS. 23A and 23B.

As illustrated in FIG. 23A, the shielding portion 71 of the present embodiment is formed in a layout in which a plurality of diagonal stripe shapes is arrayed at predetermined pitches in an inclined manner from upper right to lower left in FIG. 23A in a direction intersecting with bundles of vertical signal lines M3. With the layout, the shielding portion 71 of the present embodiment partially covers the vertical signal lines M3. Further, as illustrated in FIG. 21B, the shielding portion 72 of the present embodiment is formed in a layout in which diagonal stripe shapes inclined from upper left to lower right in FIG. 23B are arranged. Note that the shielding portions 71 and 72 of the present embodiment may not be arranged in accordance with the arrangement interval of the bundles of the vertical signal lines M3 or the FD pitch of the pixel units. The solid state image sensor 31 of the present embodiment has similar effects to the solid state image sensor 31 of the first embodiment.

11. Solid State Image Sensor of Ninth Embodiment

FIG. 24A is an enlarged configuration diagram illustrating a shielding portion 71 of a first semiconductor substrate 26 of a ninth embodiment. FIG. 24B is an enlarged configuration diagram illustrating a shielding portion 72 of a second semiconductor substrate 28 of the ninth embodiment. The ninth embodiment of a solid state image sensor according to the present technology will be described using FIGS. 24A and 24B.

As illustrated in FIG. 24A, the shielding portion 71 of the present embodiment is formed in a layout in which a plurality of rectangular (including square) shapes is arrayed in a checkered pattern on a surface of the first semiconductor substrate 26. Further, as illustrated in FIG. 24B, the shielding portion 72 of the present embodiment is formed in a layout in which an interlayer insulating film 66 is included and a horizontal stripe shape is arranged at a position overlapping with the shielding portion 71 as viewed from the top, similarly to the first embodiment. The solid state image sensor 31 of the present embodiment has similar effects to the solid state image sensor 31 of the first embodiment. Note that the plurality of squares of the shielding portion 71 may be arrayed not only in directions parallel to and perpendicular to vertical signal lines M3 but also in a direction diagonally inclined with respect to the vertical signal lines M3.

12. Solid State Image Sensor of Tenth Embodiment

A tenth embodiment of a solid state image sensor according to the present technology will be described using FIG. 25. A different point of the present embodiment from the first embodiment in FIG. 16 is that two layers of second semiconductor substrates 54 are laminated in a second semiconductor substrate 28. Wiring 57c of an interlayer insulating film and wiring 57c of the second semiconductor substrate 54 bonded with the interlayer insulating film are electrically connected with wiring 904. A solid state image sensor 31 of the present embodiment can further achieve high functionality of the image sensor and reduction of a chip size by laminating substrates having various functions with the three layers of semiconductor substrates, in addition to having similar effects to the solid state image sensor 31 of the first embodiment. Note that the number of the lamination of the semiconductor substrates of the solid state image sensor according to an embodiment of the present technology is not limited to three or less and may be four or more.

13. Electronic Device of Eleventh Embodiment

An eleventh embodiment of a solid state image sensor according to the present technology will be described using FIG. 26. FIG. 26 is a diagram illustrating an electronic device according to an embodiment of the present technology. The above-described solid state image sensors according to an embodiment of the present technology can be applied to electronic devices such as camera systems such as a digital camera and a video camera, a mobile phone having an imaging function, and other devices having an imaging function.

FIG. 26 illustrates the eleventh embodiment applied to a camera as an example of an electronic device according to the present technology. The camera according to the present embodiment example is a video camera capable of capturing a still image or a moving image. A camera 201 according to the present embodiment includes a solid state image sensor 202, an optical system 203 that guides incident light into a light-receiving portion of the solid state image sensor 202, and a shutter device 204. Further, the camera 201 includes a drive circuit 205 that drives the solid state image sensor 202 and a signal processing circuit 206 that processes an output signal of the solid state image sensor 202.

Any of the solid state image sensors of the above-described embodiments is applied to the solid state image sensor 202. The optical system (optical lens) 203 images image light (incident light) from an object on an imaging surface of the solid state image sensor 202. With the imaging, a signal charge is accumulated in the solid state image sensor 202 for a fixed period. The optical system 203 may be an optical lens system configured from a plurality of optical lenses. The shutter device 204 controls a light illumination period and a shielding period for the solid state image sensor 202. The drive circuit 205 supplies a drive signal that controls a transfer operation of the solid state image sensor 202 and a shutter operation of the shutter device 204. Signal transfer of the solid state image sensor 202 is performed by the drive signal (timing signal) supplied from the drive circuit 205. The signal processing circuit 206 performs various types of signal processing. A video signal for which the signal processing has been performed is stored in a storage medium such as a memory or is output to a monitor.

According to the electronic device of the eleventh embodiment, the back illuminated solid state image sensor 202 in the above-described present technology is included. Therefore, light emitted due to hot carrier from a MOS transistor of a logic circuit does not enter a pixel array side, and dark currents and random noises can be suppressed. Therefore, an electronic device having high image quality can be provided. For example, a camera with improved image quality can be provided.

Note that embodiments of the present technology are not limited to the above-described embodiments, and various changes can be made without departing from the gist of the present technology. For example, an embodiment of a combination of all or a part of the above-described plurality of embodiments can be employed. Moreover, for example, each of the layouts of the shielding portion of the first chip presented by FIGS. 6A, 17A, 18A, 19A, 20A, 21A, 22A, 23A and 24A may be combined with any one of the layouts of the shielding portion of the second chip presented by FIGS. 6B, 17B, 18B, 19B, 20B, 21B, 22B, 23B and 24B.

Further, the present technology can employ the following configurations.

(1) A solid state image sensor including:
a first semiconductor substrate in which a first insulating film and a pixel array are formed; and a second semiconductor substrate, bonded with the first semiconductor substrate, in which a second insulating film and a logic circuit are formed, in which
a conductor is formed in at least one of the first insulating film and the second insulating film, and
a region where the first insulating film and the second insulating film are connected is included in a bonding surface of the first semiconductor substrate and the second semiconductor substrate.

(2) The solid state image sensor according to (1), in which
a first conductor and a second conductor are respectively formed in the first insulating film and the second insulating film, and the first conductor and the second conductor overlap with each other on the bonding surface.

(3) The solid state image sensor according to (2), in which
surface occupancy ratios of areas in contact with the bonding surface are different between the first conductor and the second conductor.

(4) The solid state image sensor according to (2), in which
the surface occupancy ratio of the first conductor or the second conductor having a larger area in contact with the bonding surface, of the first conductor and the second conductor overlapping with each other, is 30 to 90%.

(5) The solid state image sensor according to (2), in which
the surface occupancy ratio of the first conductor or the second conductor having a larger area in contact with the bonding surface, of the first conductor and the second conductor overlapping with each other, is 40 to 70%.

(6) The solid state image sensor according to (2), in which
the surface occupancy ratio of the first conductor or the second conductor having a smaller area in contact with the bonding surface, of the first conductor and the second conductor overlapping with each other, is 0 to 50%.

(7) The solid state image sensor according to (2), in which
the surface occupancy ratio of the first conductor or the second conductor having a smaller area in contact with the bonding surface, of the first conductor and the second conductor overlapping with each other, is 0 to 30%.

(8) The solid state image sensor according to (1), in which
a length in a width direction of the conductor being in contact with the bonding surface is 10 um or less.

(9) The solid state image sensor according to (1), in which
a length in a width direction of the conductor being in contact with the bonding surface is 1 um or less.

(10) The solid state image sensor according to (1), in which
wiring and a connection hole that perform potential clamp of the conductor are formed in the first semiconductor substrate.

(11) The solid state image sensor according to (1), in which
wiring and a connection hole that perform potential clamp of the conductor are formed in the second semiconductor substrate.

(12) The solid state image sensor according to (1), in which
wiring and a connection hole that perform potential clamp of the conductor are formed in both the first semiconductor substrate and the second semiconductor substrate.

(13) The solid state image sensor according to (1), in which a size of a planar shape of the conductor, the planar shape covering the pixel array, is a size of a planar shape of the pixel array or more.

(14) The solid state image sensor according to (1), in which the conductor is arranged to cover at least a part of a signal line of an analog circuit in a direction of the bonding surface with respect to the signal line.

(15) The solid state image sensor according to (14), in which the conductor is arranged to cover 30% or more of the signal line.

(16) The solid state image sensor according to (14), in which the conductor is arranged to cover 50% or more of the signal line.

(17) The solid state image sensor according to (14), in which a plurality of the conductors is formed, and the plurality of conductors is arrayed in accordance with an arrangement interval of the signal lines.

(18) The solid state image sensor according to (14), in which a plurality of the conductors is formed, and an array direction of the plurality of conductors is an inclined direction with respect to a direction of the signal line.

(19) A method of manufacturing a solid state image sensor, including:

forming a first insulating film and a pixel array in a first semiconductor substrate; forming a second insulating film and a logic circuit in a second semiconductor substrate;

forming a conductor in at least one of the first insulating film and the second insulating film; and bonding the first semiconductor substrate and the second semiconductor substrate, in which a region where the first insulating film and the second insulating film are connected is included in a bonding surface of the first semiconductor substrate and the second semiconductor substrate.

(20) An electronic device including:

a first semiconductor substrate in which a first insulating film and a pixel array are formed; and a second semiconductor substrate, bonded with the first semiconductor substrate, in which a second insulating film and a logic circuit are formed, in which a conductor is formed in at least one of the first insulating film and the second insulating film, and a region where the first insulating film and the second insulating film are connected is included in a bonding surface of the first semiconductor substrate and the second semiconductor substrate.

(21) An imaging device, comprising:

a first chip including:

a first semiconductor substrate including a photoelectric conversion region that converts incident light into electric charge; and a first insulating layer including a first multilayer wiring electrically connected to the photoelectric conversion region, wherein the first multilayer wiring includes a first vertical signal line to output a first pixel signal based on the electric charge, and a first connection region that includes a first wiring; and a second chip including:

a second semiconductor substrate including a logic circuit to process the first pixel signal; and a second insulating layer including a second multilayer wiring electrically connected to the logic circuit, wherein the second multilayer wiring includes a second connection region that includes a second wiring, wherein the first chip and the second chip are bonded to one another via at least the first wiring and the second wiring, and wherein, in a plan view, the first wiring and the second wiring overlap with at least a portion of the first vertical signal line.

(22)

The imaging device of (21), wherein a portion of the first insulating layer and a portion of the second insulating layer are bonded to one another.

(23)

The imaging device of (21) or (22), wherein the first vertical signal line extends in a first direction, and wherein the first wiring includes a first portion extending in a first direction and overlapping the first vertical signal line in the plan view.

(24)

The imaging device of (23), wherein a width of the first portion measured in a second direction is greater than a width of the first vertical signal line measured in the second direction, and wherein the second direction is perpendicular to the first direction.

(25)

The imaging device of (23) or (24), wherein, in the plan view, the first portion overlaps an entire width of the first vertical signal line for an entire length of the first portion in the first direction.

(26)

The imaging device of any one of (23) to (25), wherein the first wiring includes a second portion extending in a second direction that is perpendicular to the first direction.

(27)

The imaging device of any one of (23) to (26), wherein the second wiring extends in the second direction.

(28)

The imaging device of (27), wherein, in the plan view, a width of the second wiring in the first direction is greater than a width of the second portion of the first wiring in the first direction.

(29)

The imaging device of (28), wherein, in the plan view, the second wiring and the second portion of the first wiring overlap.

(30)

The imaging device of (28) or (29), wherein, in the plan view, the second wiring overlaps an entirety of the second portion of the first wiring.

(31)

The imaging device of (21) or (22), wherein the first vertical signal line extends in a first direction, and wherein the first wiring extends in a second direction that is perpendicular to the first direction, and wherein the second wiring extends in the first direction and overlaps the first vertical signal in the plan view.

(32)

The imaging device of claim (31), wherein, in the plan view, the second wiring overlaps an entirety of the first vertical signal line for an entire length of the first portion.

(33)

An imaging device, comprising:

a first chip including:

a first semiconductor substrate including a plurality of pixel regions arranged in a matrix and that convert incident light into electric charge; and a first insulating layer including a first multilayer wiring electrically connected to the plurality of pixel regions, wherein the first multilayer wiring includes a plurality of vertical signal lines to output respective pixel signals based on the electric charge, and a first connection region that includes at least one first wiring; and a second chip including:

a second semiconductor substrate including a logic circuit to process the pixel signals; and a second insulating layer including a second multilayer wiring electrically connected to the logic circuit, wherein the second multilayer wiring includes a second connection region that includes at least one second wiring, wherein the first chip and the second chip are bonded to one another via at least the at least one first wiring and the at least one second wiring, and wherein, in a plan view, the at least one first wiring and the at least one second wiring overlap with the plurality of vertical signal lines.

(34)

The imaging device of (33), wherein the plurality of vertical signal lines extend in a first direction and are arranged in the first multilayer wiring at a first regular interval in a second direction perpendicular to the first direction, and wherein the at least one first wiring is a plurality of first wirings that include first portions extending in the first direction and arranged in the first multilayer wiring at a second regular interval in the second direction.

(35)

The imaging device of (34), wherein the first regular interval and the second regular interval correspond to a pitch between two of the plurality of pixel regions.

(36)

The imaging device of (34), wherein the first regular interval corresponds to a pitch between two of the plurality of pixel regions, and the second regular interval corresponds to half of the pitch.

(37)

The imaging device of any one of (34) to (36), wherein the plurality of first wirings includes a second portion that extends in the second direction.

(38)

The imaging device of any one of (33) to (37), wherein the at least one second wiring is a plurality of second wirings that include first portions extending in a first direction, and wherein the at least one first wiring extends in a second direction that is perpendicular to the first direction.

(39)

The imaging device of any one of (33) to (38), wherein the at least one second wiring includes second wiring portions for respective ones of the plurality of pixel regions.

(40)

An electronic apparatus, comprising:

an imaging device including:

a first chip including:

a first semiconductor substrate including a photoelectric conversion region that converts incident light into electric charge; and a first insulating layer including a first multilayer wiring electrically connected to the photoelectric conversion region, wherein the first multilayer wiring includes a first vertical signal line to output a first pixel signal based on the electric charge, and a first connection region that includes a first wiring; and a second chip including:

a second semiconductor substrate including a logic circuit to process the first pixel signal; and a second insulating layer including a second multilayer wiring electrically connected to the logic circuit, wherein the second multilayer wiring includes a second connection region that includes a second wiring, wherein the first chip and the second chip are bonded to one another via at least the first wiring and the second wiring, and wherein, in a plan view, the first wiring and the second wiring overlap with at least a portion of the first vertical signal line.

REFERENCE SIGNS LIST 1, 1a to 1c, 31 Solid state image sensor
2 Pixel
3, 23, 34 Pixel array (pixel region)
4 Vertical drive circuit
5 Column signal processing circuit
6 Horizontal drive circuit
7 Output circuit
8, 24, 24-1, 24-2 Control circuit
9, VSL1 Vertical signal line
10 Horizontal signal line
21, 33 First semiconductor substrate
22, 54 Second semiconductor substrate
25, 55 Logic circuit
26 First semiconductor substrate
28 Second semiconductor substrate
30, 50 Semiconductor well region
32 Laminated semiconductor substrate
33a Surface
35a to 35d, 36, 57a to 57c, 58, 904 Wiring
37, 59 Multilayer wiring layer
38 Insulating layer
39 Light shielding film
40 Bonding surface
41 Optical black region
42 Effective pixel array
43 Flattened film
44 Color filter
45 On-semiconductor substrate lens
47, 48 P-type semiconductor region
49, 61 Source/drain region
51, 63 Element separation region
52, 64 Conductive via
53, 56, 66 Interlayer insulating film
62 Gate electrode
68 Shielding layer
71 Shielding portion (first conductor)
72 Shielding portion (second conductor)
75, 81 Cu diffusion barrier insulating film
76, 82 First insulating layer
77, 83 Second insulating layer
78, 79, 84, 85 Opening portion
80, 86 via hole
900, 901 Insulating thin film
PD Photodiode
Tr1, Tr2 Pixel transistor
M1 to M4, M11 to M14 Metal
FD Floating diffusion
Tr11 to Tr14 MOS transistor

What is claimed is:
1. An imaging device, comprising:
a first chip including:
a first semiconductor substrate including a photoelectric conversion region that converts incident light into electric charge; and a first insulating layer including a first multilayer wiring electrically connected to the photoelectric conversion region, wherein the first multilayer wiring includes a first vertical signal line (VSL1) to output a first pixel signal based on the electric charge, and a first connection region (M4) that includes a first wiring, wherein the first vertical signal line (VSL1) is formed in a different layer of the first multilayer wiring than a layer of the first wiring; and a second chip including:

a second semiconductor substrate including a logic circuit to process the first pixel signal; and a second insulating layer including a second multilayer wiring electrically connected to the logic circuit, wherein the second multilayer wiring includes a second connection region (M14) that includes a second wiring, wherein the first chip and the second chip are bonded to one another via at least the first wiring and the second wiring, and wherein, in a plan view, the first wiring and the second wiring overlap with at least a portion of the first vertical signal line (VSL1).

2. The imaging device of claim 1, wherein a portion of the first insulating layer and a portion of the second insulating layer are bonded to one another.

3. The imaging device of claim 1, wherein the first vertical signal line (VSL1) extends in a first direction, and wherein the first wiring includes a first portion extending in the first direction and overlapping the first vertical signal line (VSL1) in the plan view.

4. The imaging device of claim 3, wherein a width of the first portion measured in a second direction is greater than a width of the first vertical signal line (VSL1) measured in the first direction, and wherein the second direction is perpendicular to the first direction.

5. The imaging device of claim 3, wherein, in the plan view, the first portion overlaps an entire width of the first vertical signal line (VSL1) for an entire length of the first portion in the first direction.

6. The imaging device of claim 3, wherein the first wiring includes a second portion extending in a second direction that is perpendicular to the first direction.

7. The imaging device of claim 6, wherein the second wiring extends in the second direction.

8. The imaging device of claim 7, wherein, in the plan view, a width of the second wiring in the first direction is greater than a width of the second portion of the first wiring in the first direction.

9. The imaging device of claim 8, wherein, in the plan view, the second wiring and the second portion of the first wiring overlap.

10. The imaging device of claim 8, wherein, in the plan view, the second wiring overlaps an entirety of the second portion of the first wiring.

11. The imaging device of claim 1, wherein the first vertical signal line (VSL1) extends in a first direction, and wherein the first wiring extends in a second direction that is perpendicular to the first direction, and wherein the second wiring extends in the first direction and overlaps the first vertical signal (VSL1) in the plan view.

12. The imaging device of claim 11, wherein, in the plan view, the second wiring overlaps an entirety of the first vertical signal line (VSL1) for an entire length of the first portion.

13. An imaging device, comprising:

a first chip including:

a first semiconductor substrate including a plurality of pixel regions arranged in a matrix and that convert incident light into electric charge; and a first insulating layer including a first multilayer wiring electrically connected to the plurality of pixel regions, wherein the first multilayer wiring includes a plurality of vertical signal lines (VSL1) to output respective pixel signals based on the electric charge, and at least one first wiring, wherein the first vertical signal line (VSL1) is formed in a different layer of the first multilayer wiring than a layer of the at least one first wiring; and a second chip including:

a second semiconductor substrate including a logic circuit to process the respective pixel signals; and a second insulating layer including a second multilayer wiring electrically connected to the logic circuit, wherein the second multilayer wiring includes at least one second wiring, wherein the first chip and the second chip are bonded to one another via at least the at least one first wiring and the at least one second wiring, and wherein, in a plan view, the at least one first wiring and the at least one second wiring overlap with the plurality of vertical signal lines (VSL1).

14. The imaging device of claim 13, wherein the plurality of vertical signal lines (VSL1) extend in a first direction and are arranged in the first multilayer wiring at a first regular interval in a second direction perpendicular to the first direction, and wherein the at least one first wiring is a plurality of first wirings that include first portions extending in the first direction and arranged in the first multilayer wiring at a second regular interval in the second direction.

15. The imaging device of claim 14, wherein the first regular interval and the second regular interval correspond to a pitch between two of the plurality of pixel regions.

16. The imaging device of claim 14, wherein the first regular interval corresponds to a pitch between two of the plurality of pixel regions, and the second regular interval corresponds to half of the pitch.

17. The imaging device of claim 14, wherein the plurality of first wirings includes a second portion that extends in the second direction.

18. The imaging device of claim 13, wherein the at least one second wiring is a plurality of second wirings that include first portions extending in a first direction, and wherein the at least one first wiring extends in a second direction that is perpendicular to the first direction.

19. The imaging device of claim 13, wherein the at least one second wiring includes second wiring portions for respective ones of the plurality of pixel regions.

20. An electronic apparatus, comprising:

an imaging device including:

a first chip including:

a first semiconductor substrate including a photoelectric conversion region that converts incident light into electric charge; and a first insulating layer including a first multilayer wiring electrically connected to the photoelectric conversion region, wherein the first multilayer wiring includes a first vertical signal line (VSL1) to output a first pixel signal based on the electric charge, and a first wiring, wherein the first vertical signal line (VSL1) is formed in a different layer of the first multilayer wiring than a layer of the first wiring; and a second chip including:
a second semiconductor substrate including a logic circuit to process the first pixel signal; and
a second insulating layer including a second multilayer wiring electrically connected to the logic circuit, wherein the second multilayer wiring includes a second wiring,
wherein the first chip and the second chip are bonded to one another via at least the first wiring and the second wiring, and
wherein, in a plan view, the first wiring and the second wiring overlap with at least a portion of the first vertical signal line (VSL1).

* * * * *